United States Patent [19]

Iwakiri et al.

[11] Patent Number: 5,509,020
[45] Date of Patent: Apr. 16, 1996

[54] VITERBI DECODING APPARATUS AND METHODS

[75] Inventors: Naohiko Iwakiri, Tokyo; Katsuya Yamamoto, Kanagawa, both of Japan

[73] Assignee: Sony Corporation, Japan

[21] Appl. No.: 249,176

[22] Filed: May 25, 1994

[30] Foreign Application Priority Data

May 27, 1993 [JP] Japan ................... 5-126221

[51] Int. Cl.$^6$ ........................... G06F 11/10; H03M 13/12
[52] U.S. Cl. ............................................ 371/43; 375/341
[58] Field of Search ................. 371/43, 49.1; 375/340, 375/341

[56] References Cited

U.S. PATENT DOCUMENTS 4,015,238  3/1977  Davis ........................................ 371/43
5,272,726 12/1993  Furuya et al. ........................... 375/341
5,311,523  5/1994  Serizawa et al. ........................ 371/43
5,325,402  6/1994  Ushirokawa ............................ 375/341
5,375,129 12/1994  Cooper .................................... 371/43

*Primary Examiner*—Paul P. Gordon
*Attorney, Agent, or Firm*—Limbach & Limbach; Charles P. Sammut

[57] ABSTRACT

A received data decoding apparatus receives and decodes transmitted convolutional code data. The received data is formed of a first channel whose data rate is fixed and a second channel whose data rate is variable. The received data decoding apparatus includes a most likelihood decoder for decoding the received data on the basis of a Viterbi algorithm and a data rate decision unit for obtaining a predetermined data rate of the second channel determined according to a path metric amount which is a decoded output from the most likelihood decoder.

24 Claims, 17 Drawing Sheets

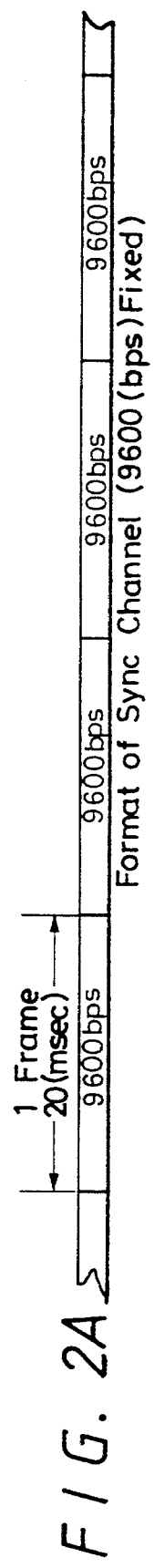
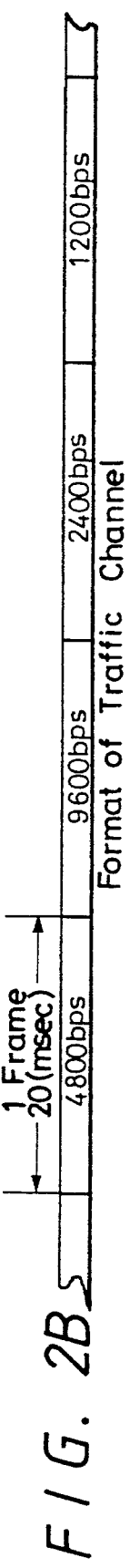
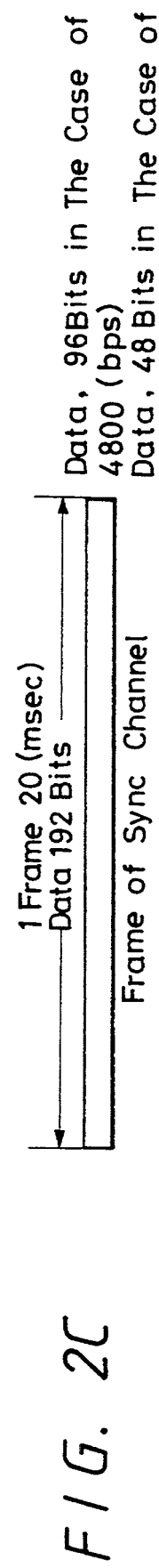
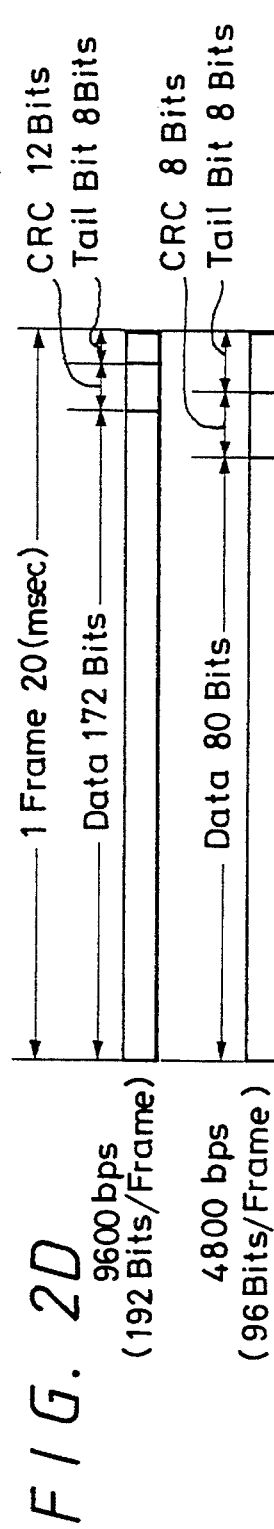
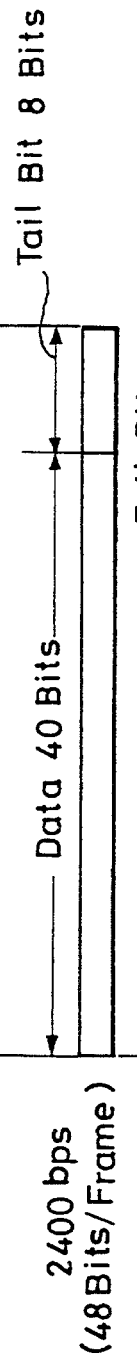
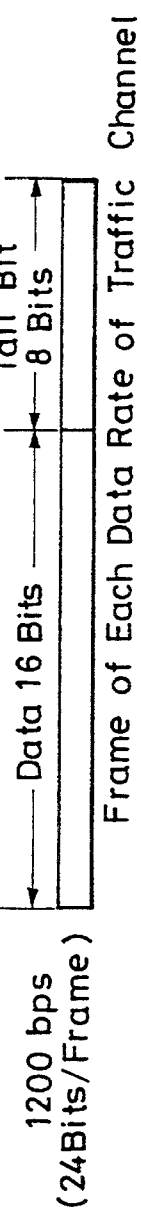
FIG. 2A Format of Sync Channel (9600 (bps) Fixed)
FIG. 2B Format of Traffic Channel
FIG. 2C Frame of Sync Channel
FIG. 2D Frame of Each Data Rate of Traffic Channel

VITERBI DECODING APPARATUS AND METHODS

BACKGROUND OF THE INVENTION

1. Field of the Invention

The present invention relates to decoding apparatus and, more particularly, to a Viterbi decoding apparatus for use in some suitable reception unit of a CDMA (code division multiple access) system cellular telephone which is one of the mobile radio communication systems.

2. Description of the Related Art

A method of decoding a convolutional code signal by using a so-called Viteri algorithm has heretofore been proposed.

Specifically, in this decoding method, a branch metric of one code block is calculated from a received symbol, and a new remaining path is selected on the basis of the branch metric and path metric of the remaining path of each state in the preceding decoding step. Further, the path metric corresponding to the new remaining path of each state and a corresponding coder input data sequence are memorized in a path memory.

On the other hand, a most likelihood remaining path at that timing point is selected from remaining paths of respective states. Then, a coder input bit obtained at a timing point returned by an amount of path memory length along the selected path of the memorized coder input data sequence is output as decoded data. The decoding is carried out by using such decoding algorithm.

In communication systems to which the CDMA system used in mobile radio communication is applied, transmission data is coded into a convolutional code and then transmitted on the transmission side. Recently, as such communication system, there is proposed a communication system which includes a sync (synchronizing) channel (first transmission channel) having a fixed data rate in which data is continuously transmitted without a tail bit at the frame unit and a traffic channel (second transmission channel) having a data rate variable at the frame unit in which a tail bit is added to data at the frame unit and data is transmitted at the frame unit.

In this communication system, the fixed data rate of the sync channel is determined previously so that the reception side can know the data rate. On the other hand, there is proposed a communication system having a traffic channel in which data is transmitted with unknown data rate. According to this communication system, the reception side must determine a decoding data rate by discriminating data rates of unknown frames of the traffic channel.

However, there is not proposed a method suitable for determining a decoding data rate.

Further, even when data rate of every frame of the traffic channel is transmitted, such data is not always correct. Specifically, it is considered that an error occurs in transmission or decoding, for example, so that data is decoded at an erroneous data rate. Therefore, also in this case, it is requested that a data rate of every frame of the traffic channel is discriminated on the reception side.

SUMMARY OF THE INVENTION

In view of the aforesaid aspects, it is an object of the present invention to provide a decoding apparatus of a simple arrangement in which a data rate used when data is decoded can be determined by deciding data rates at every unknown frame of a traffic channel.

According to a first aspect of the present invention, there is provided a received data decoding apparatus for receiving and decoding transmitted convolutional code data, the received data being formed of a first channel whose data rate is fixed and a second channel whose data rate is variable. The received data decoding apparatus is comprised of most likelihood decoding means for decoding the received data on the basis of a Viterbi algorithm, and data rate deciding means for obtaining a predetermined data rate of the second channel determined in correspondence with a path metric amount in accordance with the path metric amount which is a decoded output from the most likelihood decoding means.

According to a second aspect of the present invention, there is provided a received data decoding apparatus for receiving and decoding transmitted convolutional code data, the received data being formed of a first channel whose data rate is fixed and a second channel whose data rate is variable. The received data decoding apparatus is comprised of most likelihood decoding means for decoding the received data on the basis of a Viterbi algorithm, symbol error rate calculating means for calculating a symbol error rate of the received data by using an output from the most likelihood decoding means, and data rate deciding means for obtaining a predetermined data rate of the second channel determined in correspondence with a path metric amount in accordance with the path metric amount which is a decoded output from the most likelihood decoding means.

According to the decoding apparatus of the present invention, the most likelihood decoding means decodes received data in a most likelihood decoding fashion on the basis of the Viterbi algorithm. Then, a variable data rate of a second channel is decided on the basis of an output from the most likelihood decoding means. Therefore, the data rate can be decided with ease.

According to the decoding apparatus of the present invention, the symbol error rate is calculated on the basis of the output from the most likelihood decoding means, and the data rate of the second channel is decided on the basis of the calculated symbol error rate and a path metric amount which is one of the outputs from the most likelihood decoding means. Therefore, the data rate can be decided with high accuracy.

According to the decoding apparatus of the present invention, the second channel includes an error detection code and an error detection is carried out on the basis of the error detection code output from the most likelihood decoding means. Then, the data rate of the second channel is decided on the basis of the error detected result, the symbol error rate and the path metric amount. Therefore, the data rate can be decided with high accuracy.

According to the decoding apparatus of the present invention, a threshold value of symbol error rate or path metric amount is set at every data rate of the second channel on the basis of the output from the most likelihood decoding means, and the threshold value and the symbol error rate and the path metric amount are compared with each other. Then, the data rate of the second channel is decided on the basis of the compared result. Therefore, the data can be decided with ease.

According to the decoding apparatus of the present invention, the threshold value setting means sets a threshold value on the basis of the output of the most likelihood decoding means corresponding to the first channel. Therefore, there is plenty of time to decide the data rate after the threshold value was set. Thus, it is possible to prevent too much load from being put on the apparatus.

According to the decoding apparatus of the present invention, the threshold value setting means sets a threshold value on the basis of the output from the most likelihood decoding means corresponding to the second channel. Therefore, the threshold value is set immediately before the data rate is decided so that the data rate can be decided with high accuracy.

According to the decoding apparatus of the present invention, the threshold value is set at every reliability. Then, the symbol error rate and the path metric amount are sequentially compared with threshold values of high reliability at high to low data rates and also compared with threshold value of reliability next to the former one at high to low data rates. Therefore, when the symbol error rate and the path metric amount correspond to the threshold values of high reliability and high data rate, the decided result of data rate can be obtained immediately.

Further, according to the decoding apparatus of the present invention, the threshold value setting means sets the threshold value at every reliability. If a circuit disconnect specification estimated when the data rate of the second channel is decided is worse than that estimated when the threshold value setting means sets the threshold value, then the reliability of the threshold value applied in order to decide the data rate of the second channel is lowered and output. Accordingly, the reliability of the decided result of the data rate is varied. When the reliability is low, the decided result is not used. Therefore, it is possible to prevent the apparatus from malfunctioning.

Further, according to the decoding apparatus of the present invention, the sequential order of the threshold values set at every data rate of the second channel and which are to be compared with the symbol error rate and the path metric amount is determined on the basis of the error detected result of the error detection means. Therefore, the data rate can be decided rapidly with higher accuracy.

Furthermore, according to the decoding apparatus of the present invention, the threshold values are compared with the symbol error rate and the path metric amount in the sequential order of threshold values corresponding to data rates that the second channel can take with large possibility. Therefore, the data rate can be decided more rapidly.

BRIEF DESCRIPTION OF THE DRAWINGS

FIGS. 2A, 2B, 2C, and 2D are diagrams showing formats of a sync. channel and a traffic channel;

DETAILED DESCRIPTION OF THE PREFERRED EMBODIMENTS

The present invention will now be described with reference to the drawings.

Figure 1:
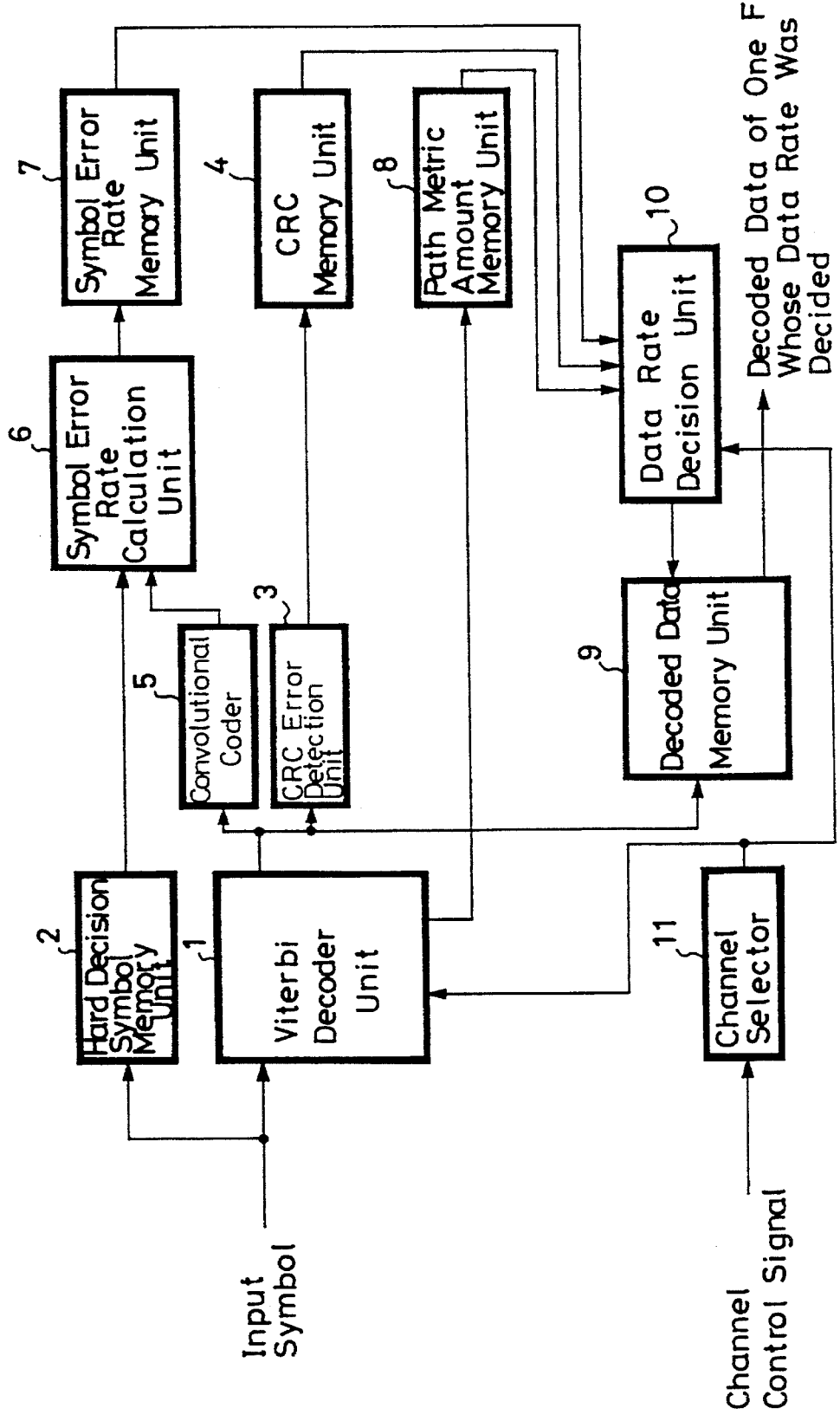
FIG. 1 is a block diagram showing a first embodiment of a mobile radio set to which there is applied a decoding apparatus according to the present invention.

FIG. 1 shows in block form an arrangement of a first embodiment of a mobile radio communication system, such as a cellular telephone or the like to which there is applied a decoding apparatus according to the present invention. This mobile radio set performs a communication on the basis of the CDMA system, for example.

In this embodiment, a convolution code used herein has a coding rate of ½ and a constraint length of 9 and is generated from the following generation polynomial:

$$G1(x)=x^8+x^7+x^5+x^3+x^2+x+1$$

$$G2(x)=x^8+x^4+x^3+x^2+1$$

A path memory length of a Viterbi decoder unit 1, which will be described later on, is 48 for sync chip and 64 for traffic channel, for example.

FIGS. 2A through 2D show specifications of channels received by the mobile radio communication system according to the present invention. Specifically, FIG. 2A shows a format of a sync channel. As shown in FIG. 2A, the sync channel is continuously transmitted during the frame period of 20 ms of one frame at the known fixed rate of 9600 bps. FIG. 2B show a format of the traffic channel. As shown in FIG. 2B, this traffic channel is continuously transmitted during the frame period of 20 ms of one frame in such a manner that desired one data rate of four data rates of 9600 bps, 4800 bps, 2400 bps and 1200 bps is selected at the frame unit. FIG. 2B shows that the traffic channel is transmitted in the sequential order of 4800 bps, 9600 bps, 2400 bps and 1200 bps.

FIG. 2C shows a frame arrangement of a sync channel. As shown in FIG. 2C, one frame is formed of 192-bit data (e.g., time information used to synchronize the transmission side and the mobile radio communication system shown in FIG. 1). FIG. 2D shows frame arrangements of the traffic channels of 9600 bps, 4800 bps, 2400 bps and 1200 bps, respectively. As shown in FIG. 2D, the traffic channel of 9600 bps is formed of 172-bit data (e.g., audio data, etc.) serving as original information, 12-bit error detection data (e.g., CRC (cyclic redundancy check) code, etc.) and 8-bit tail bit of all zeros. The traffic channel of 4800 bps is formed of 80-bit data, 8-bit CRC code and 8-bit tail bit of all zero. The traffic channel of 2400 bps is formed of 40-bit data and 8-bit tail bit of all zero. The traffic channel of 1200 bps is formed of 16-bit data and 8-bit tail bit of all zero. The tail bit is used to reset (all zero) data of a shift register in a Viterbi decoder.

The mobile radio communication system shown in FIG. 1 receives data by switching two channels in the order of the sync channel and the traffic channel, and decodes convolutional data in a most likelihood method according to the viterbi algorithm to thereby decide a data rate of the traffic channel.

Specifically, as shown in FIG. 1, the Viterbi decoder unit 1 decodes input symbol, received and demodulated by a reception circuit (not shown), at the frame unit of the known fixed data rate of the sync channel and the four kinds of the data rates of the traffic channel on the basis of the Viterbi algorithm, for example, in a most likelihood method. The Viterbi decoder section 1 outputs a path metric amount of the most likelihood path when decoding data in the most likelihood method.

A hard decision symbol memory unit 2 decides input symbol in a hard decision manner and memorizes a decided result. A CRC error detection unit 3 effects an error detection calculation on decoded data decoded by the Viterbi decoder unit 1 on the basis of a CRC code when an error detection code, such as a CRC code or the like is added to the decoded data. Then, the CRC error detection unit 3 outputs an error detection calculation result. A CRC memory unit 4 memorizes the CRC detection calculation result (CRC calculated result) output from the CRC error detection calculation unit 3. A convolutional coder 5 codes the decoded data decoded by the Viterbi decoder unit 1 at the same coding rate of ½ and the same constraint length 9 as those of the transmission side and outputs coded result (symbol).

A symbol error rate calculation unit 6 compares the hard decision symbol decided by the hard decision symbol memory unit 2 and the encoded symbol coded by the convolutional coder 5 at the symbol unit. If it is determined that compared symbol has an error (if a hard decision symbol and an encode symbol are not agreed) with respect to only the known fixed data rate of the sync channel (e.g., any one of 9600 bps, 4800 bps and 2400 bps and a previously-known one) (9600 bps in this embodiment)) and with respect to four data rates (9600 bps, 4800 bps, 2400 bps and 1200 bps) of the traffic channel, then the symbol error rate calculation unit 6 increments a count value of a counter incorporated therein at the frame unit. If it is determined that the compared symbol has no error, then the symbol error rate calculation unit 6 does not change the count value at the frame unit. Then, the symbol error rate calculation unit 6 outputs a compared result. For example, if a hard decision symbol is "10011011" and an encode symbol is "11010111", then an error rate is "3".

The symbol error rate memory unit 7 memorizes a symbol error rate calculated by the symbol error rate calculation unit 6. A path metric amount memory unit 8 memorizes path metric amounts of the known fixed data rate of the sync channel and the four kinds of the data rates of the traffic channel obtained when input final symbol obtained at every frame by the Viterbi decoder unit 1 is decoded. A decoded data memory unit 9 memorizes decoded data which results from decoding the sync. channel at the known fixed data rate output from the Viterbi decoder unit 1 and decoded data which results from decoding the traffic channel at the data rates of four kinds at the frame unit.

A data rate decision unit 10 decides at the frame unit a data rate having the largest possibility of being transmitted from all data rates of the traffic channels that can be transmitted. A channel selector 11 outputs control signals to the Viterbi decoder unit 1 and the data rate decision unit 10 so that the Viterbi decoder unit 1 and the data rate decision unit 10 perform the processing corresponding to the sync channel or the traffic channel.

Figure 3:
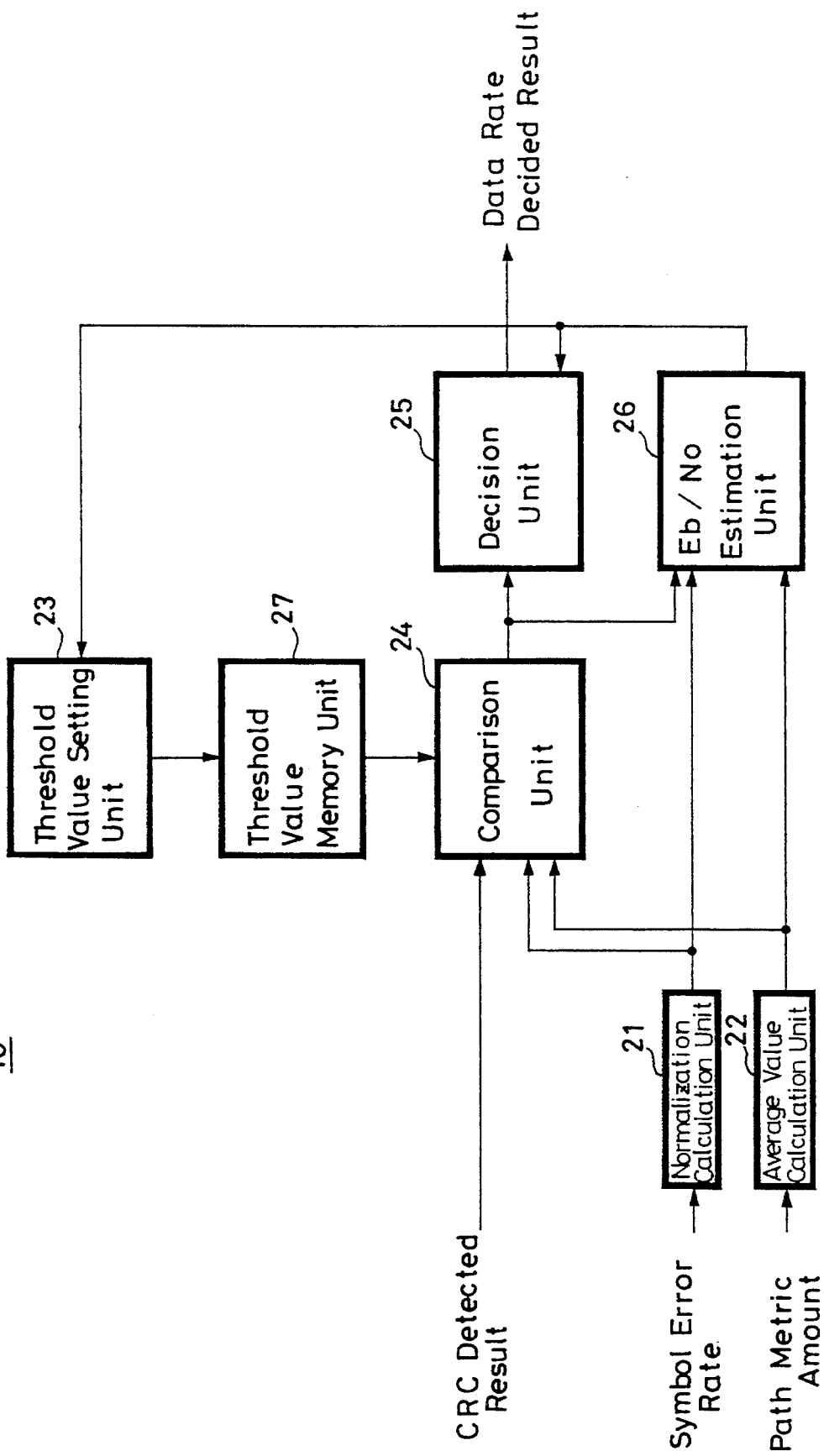
FIG. 3 is a block diagram showing a data rate judging section shown in FIG. 1 more in detail.

FIG. 3 shows in block form a circuit arrangement of the data rate decision unit 10 shown in FIG. 1 more fully. As shown in FIG. 3, a normalization calculation unit 21 normalizes symbol error rates of 9600 bps, 4800 bps, 2400 bps and 1200 bps and outputs normalized results (referred to hereinafter as normalized symbol error rates). An average value calculation unit 22 calculates average values of effective path metric amounts from path metric amounts of one frame of 9600 bps, 4800 bps, 2400 bps and 1200 bps memorized in the path metric amount memory unit 8 shown in FIG. 1, and outputs calculated results (referred to hereinafter as path metric amount average values). The effective path metric amount is a path metric amount input to a path memory (not shown) provided within the Viterbi decoder.

A threshold value setting unit 23 memorizes tables (referred to hereinafter as threshold value tables) of threshold values classified in response to an Eb/NO (i.e., transmission energy/noise of the bit unit)(line short standard) used to decide the four kinds of data rates (9600 bps, 4800 bps, 2400 bps, 1200 bps) obtained from the experimental results that had been obtained by using the traffic channels of experimental data, as will be described later on. The threshold value setting unit 23 outputs any one of the memorized threshold value tables in response to the Eb/NO output from the Eb/NO estimation unit 26 and memorizes the same in a threshold value memory unit 27 (i.e., setting the threshold value table in the threshold value memory unit 27). The threshold value memory unit 27 memorizes a threshold value table output from the threshold value setting unit 23.

The comparison unit 24 compares the CRC calculated result memorized in the CRC memory unit 4 shown in FIG. 1, the normalized symbol error rate output from the normalization calculation unit 21 and the path metric amount average value output from the average value calculation unit 22 with the threshold values of the threshold value tables memorized in the threshold value memory unit 27. Then, the comparison unit 24 outputs a compared result to a decision unit 25. The decision unit 25 decides a data rate from the compared result output from the comparison unit 24. The decision unit 25 decides data rate from the compared result output from the comparison unit 24 and outputs a decided result and a reliability representative of a reliability of decided result (the higher the reliability become the smaller the value becomes, in this embodiment).

The Eb/NO estimation unit 26 estimates an Eb/NO value on the basis of the normalized symbol error rate supplied thereto from the normalization calculation unit 21 and the path metric amount average value from the average value calculation unit 22.

FIGS. 4 through 7 are graphs of path metric amount average amount versus normalized symbol error rate average value obtained from the experimental data of 9600 bps, 4800 bps, 2400 bps and 1200 bps when the decoding is carried out under the condition that the data rates of the traffic channel are assumed to be fixed to 9600 bps, 4800 bps, 2400 bps and 1200 bps, respectively.

When these graphs are made, 10000 frames and WGN (white Gaussian noise) channel are used as the experimental data and the path metric amount average values and the normalized symbol error rate average values are calculated for Eb/NO=+1, +2, +3, +4 (dB).

Study of FIGS. 4 through 7 reveals that, if the data rate is correct (if a data rate of experiment data and the assumed data rate are equal), the path metric amount average value and the normalized symbol error rate average value both become zero in the absence of a noise and that the value becomes larger as the Eb/NO becomes worse.

Further, study of FIGS. 4 through 7 reveals that, if the data rate is not correct (if the data rate of experimental data and the assumed data rate are not equal), the path metric amount average value and the normalized symbol error rate average value represent substantially constant values regardless of the Eb/NO value.

The threshold value setting unit 23 memorizes threshold value tables in which threshold values of the path metric amount average values and the normalized symbol error rates in which the data rate of the traffic channel can be regarded as 9600 bps, 4800 bps, 2400 bps and 1200 bps are described. The threshold value tables memorized in the threshold value setting unit 23 are made in consideration of the CRC calculation results obtained by the CRC error detection unit 3 as shown on tables 1 and 2 which will be described later on.

The Eb/NO estimation unit 26 memorizes the experimental results (shown by dashed lines) shown in FIGS. 4 through 7.

Figure 8:
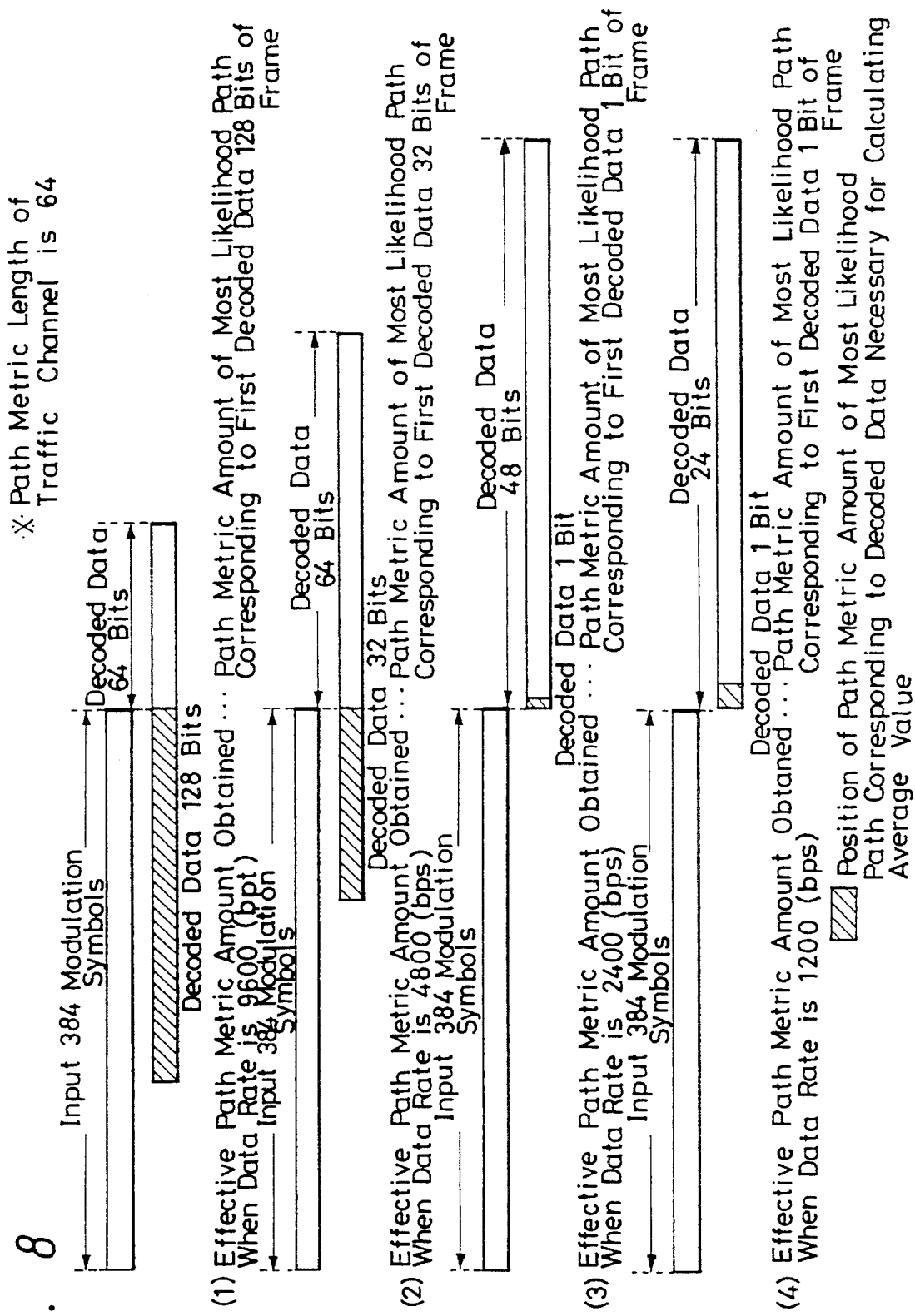
FIG. 8 is a diagram showing a bit position of decoded data necessary for calculating a path metric amount average value per frame with respect to four kinds of data rate of traffic channel data.

The average value calculation unit 22 needs decoded data (bit positions of decoded data) shown hatched in FIG. 8 in order to calculate the path metric amount average value per frame with respect to the four kinds of data rates of the traffic channel.

Operation that the fixed data rate (e.g., 9600 bps) of the sync channel is received, the decoding is changed from the sync channel to the traffic channel, data of the traffic channel is received and then the data rate of the traffic channel is decided will be described.

When the data of the sync channel is decoded, the data of the sync channel is received by the reception circuit (not shown) as described above. When the data of the sync channel is decoded successfully, the reception circuit outputs a channel control signal representing the reception of the data of the sync channel and the data rate to the channel selector 11. Then, the channel selector 11 supplies from the transmission (base station) side data representative of the input of the sync channel of the fixed data rate to the Viterbi decoder unit 1 and the data rate decision unit 10.

The Viterbi decoder unit 1 continuously decodes modulation symbols of the sync channel input at every frame at the fixed data rate (9600 bps) and outputs decoded data to the convolutional coder 5 and the decoded data memory unit 9. Also, the Viterbi decoder unit 1 outputs and memorizes a path metric amount of the most likelihood path in the path metric amount memory unit 8 each time it decodes data of one bit each.

The hard decision symbol memory unit 2 effects a hard decision on the received symbol on the basis of the modulation symbol input thereto at the same timing as that of the Viterbi decoder unit 1, and memorizes a decided result. The convolutional coder 5 codes decoded data input thereto from the viterbi decoder unit 1 one more time and outputs the encode symbol to the symbol error rate calculation unit 6.

The symbol error rate calculation unit 6 receives the hard decision symbol memorized in the hard decision symbol memory unit 2 and the encode symbol corresponding to the hard decision symbol read out from the convolutional coder 5 at the timing of the output encode symbol, and performs the calculation of logical exclusive-OR of the hard decision symbol and the encode symbol. The symbol error rate calculation unit 6 increments the count value of the counter incorporated therein by "1" if the calculated result is "1", and leaves the count value as it is if the calculated result is "0" during one frame period, and outputs and memorizes the decided result in the symbol error rate memory unit 7. Thereafter, the symbol error rate calculation unit 6 resets the count value of the counter and repeats the above-mentioned operation.

The symbol error rate memorized in the symbol error rate memory unit 7 and the path metric amount memorized in the path metric amount memory unit 8 are input to the data rate decision unit 10.

In the data rate decision unit 10 (FIG. 3), the normalization calculation unit 21 calculates the normalized symbol error rate from the symbol error rate, and the average value calculation unit 22 calculates the path metric amount average value of one frame from the path metric amount. These values are input to the Eb/NO estimation unit 26.

Simultaneously, the decision unit 25 outputs a data rate control signal to the decoded data memory unit 9 (FIG. 1) so that the decoded data memory unit 9 outputs decoded data at the data rate (in this case, 9600 bps) input (informed by) from the channel selector 11. Thus, the decoded data memory unit 9 temporarily memorizes decoded data of sync channel output from the Viterbi decoder unit 1 and outputs the memorized decoded data at the frame unit in accordance with the data rate (9600 bps) based on the data rate control signal from the data rate decision unit 10.

The Eb/NO estimation unit 26 estimates Eb/NO value from the normalized symbol error rate and the path metric average value on the basis of the experimental result (path metric amount average value versus normalized symbol error rate average value in 9600 bps in this embodiment) corresponding to the fixed data rate of the sync channel, and outputs the Eb/NO value thus estimated to the threshold value setting unit 23.

The threshold value setting unit 23 outputs and memorizes the threshold value table corresponding to the Eb/NO value output from the Eb/NO estimation unit 26 in the threshold value memory unit 27.

The above-mentioned operation is carried out during the data of sync channel is received.

Figure 4:
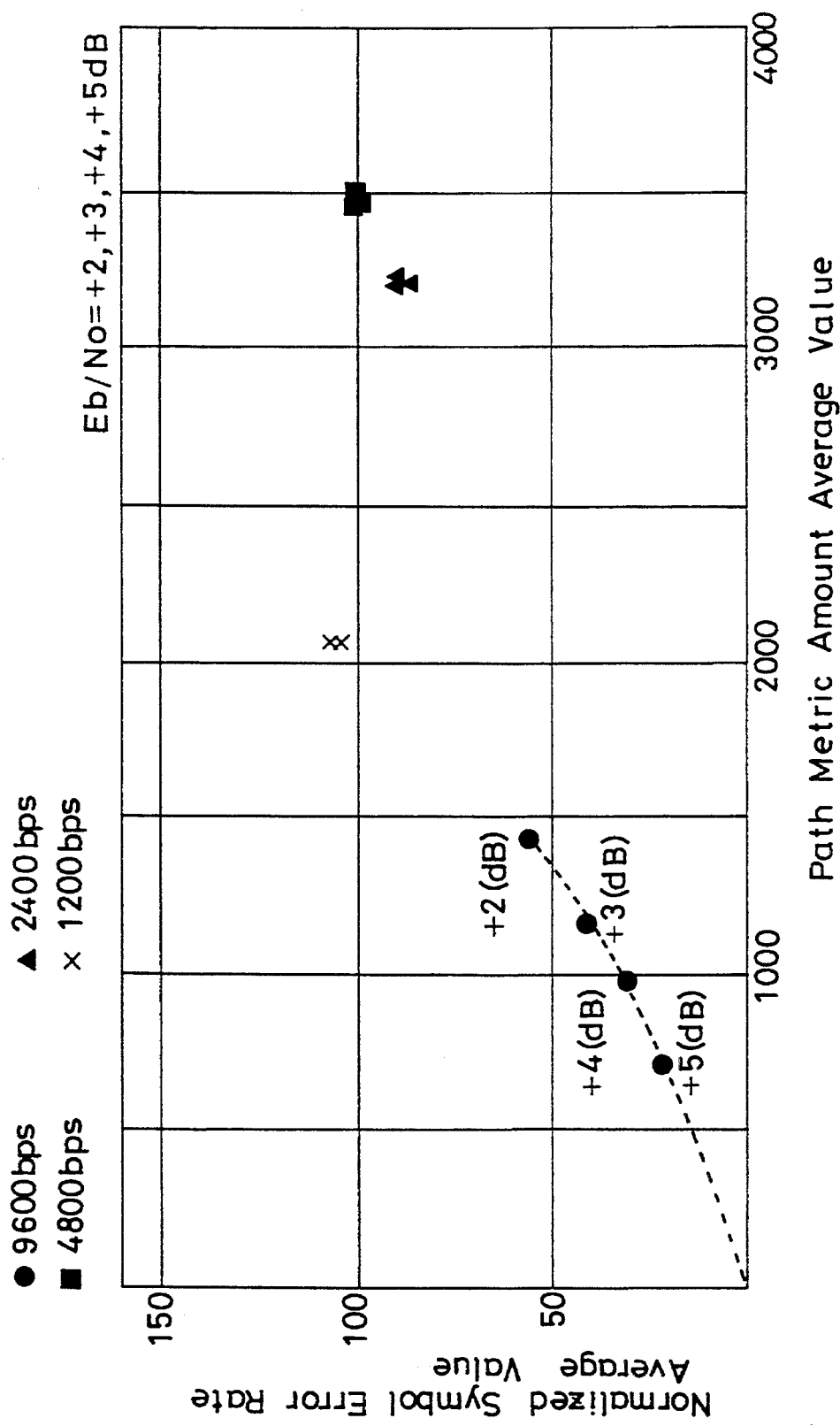
FIG. 4 is a graph showing experimental measured results of a path metric amount average value versus normalized symbol error rate average value obtained when data of the traffic channel is decoded at the fixed data rate of 9600 bps.
Figure 5:
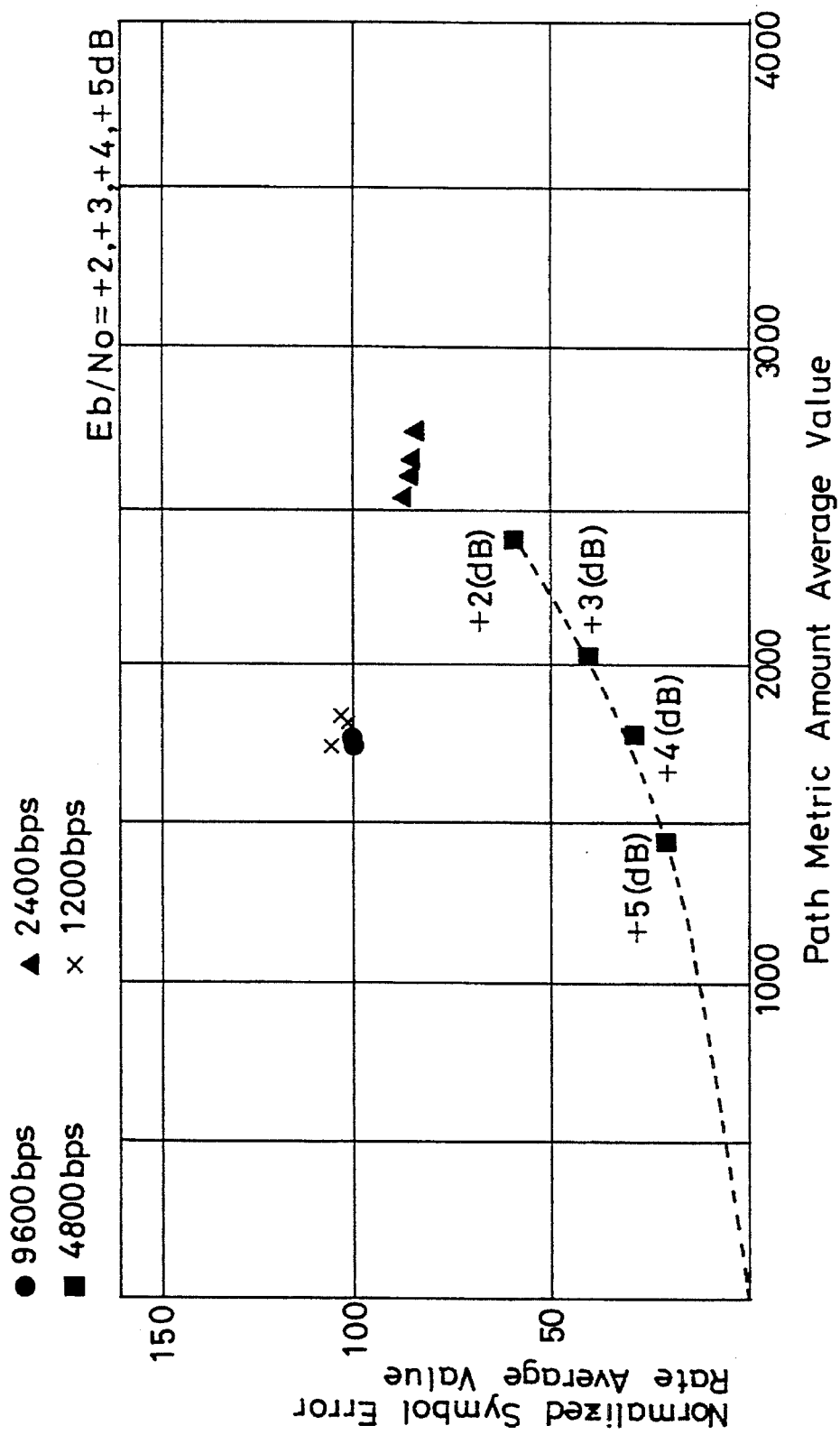
FIG. 5 is a graph showing experimental measured results of a path metric amount average value versus normalized symbol error rate average value obtained when data of the traffic channel is decoded at the fixed data rate of 4800 bps.
Figure 6:
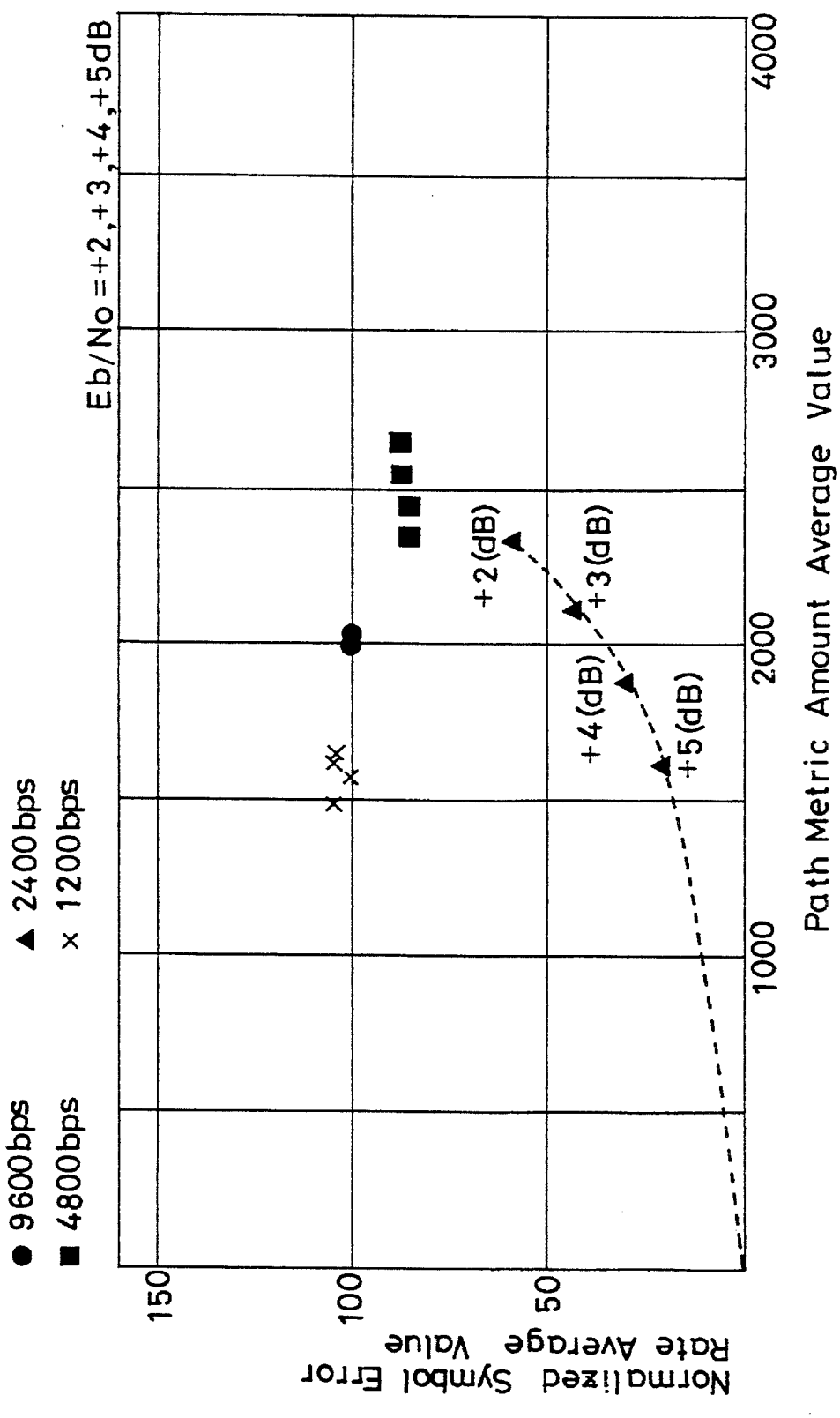
FIG. 6 is a graph showing experimental measured results of a path metric amount average value versus normalized symbol error rate average value obtained when data of the traffic channel is decoded at the fixed data rate of 2400 bps.
Figure 7:
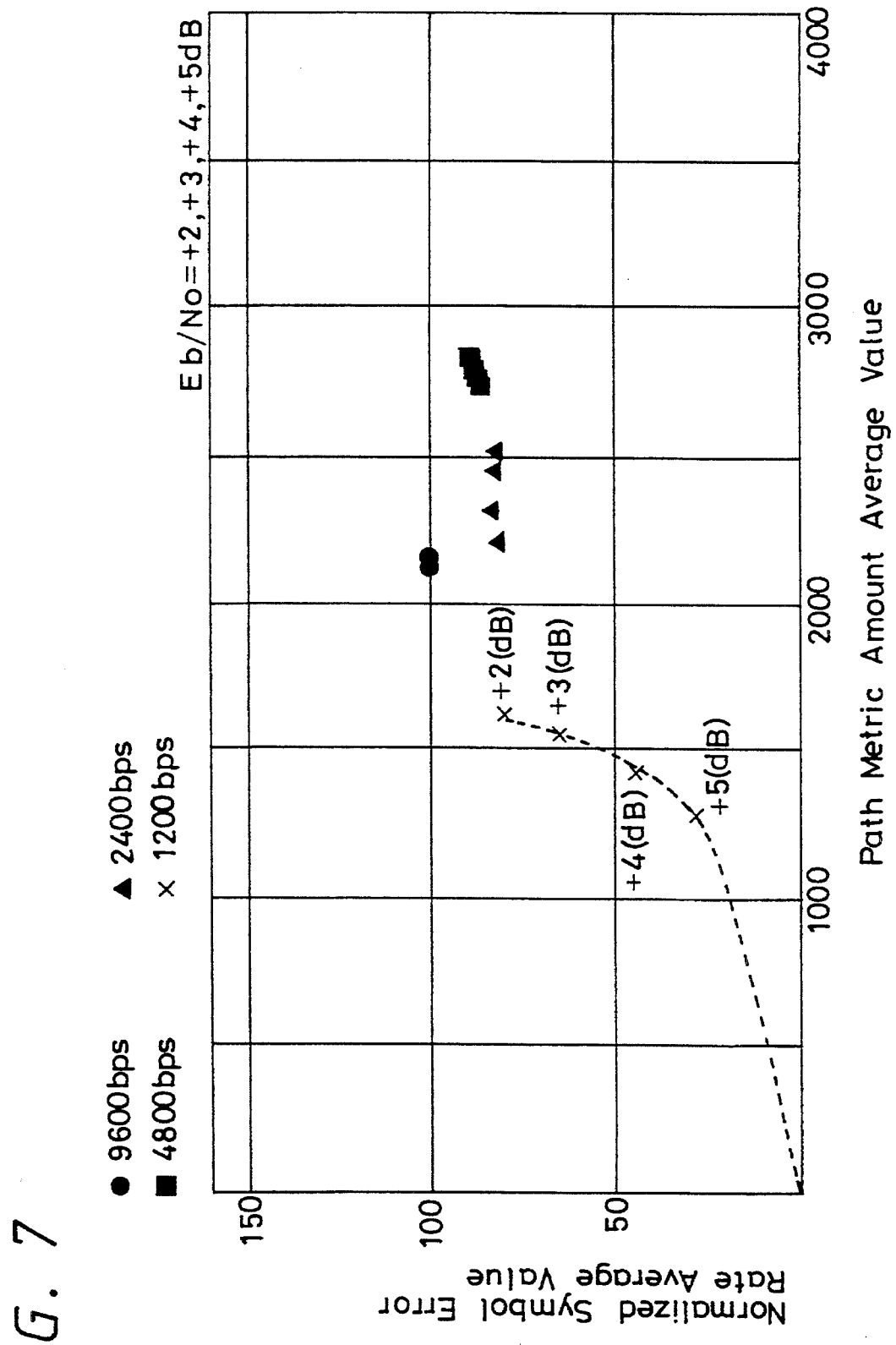
FIG. 7 is a graph showing experimental measured results of a path metric amount average value versus normalized symbol error rate average value obtained when data of the traffic channel is decoded at the fixed data rate of 1200 bps.

Assuming now that the data rate of the sync channel is 9600 bps and that the normalized symbol error rate or path metric amount average value output immediately before the decoding is switched from the sync channel to the traffic channel is 60 or 1500, then it is to be understood from FIG. 4 that the estimated Eb/NO value output from the Eb/NO estimation unit 26 becomes +2 dB. In this case, the threshold value setting unit 23 outputs and memorizes the threshold value tables shown on the following tables 1 and 2 in the threshold value memory unit 27.

TABLE 1

Threshold value (estimated Eb/NO = +2(dB)) obtained when data rate of traffic channel is decided

| Eb/NO = +2(dB) | parameter of decoded data 9600 (bps) | parameter of decoded data 4800 (bps) | parameter of decoded data 2400 (bps) | parameter of decoded data 1200 (bps) | decided data rate (bps) | reliability |
|---|---|---|---|---|---|---|
| CRC | 0 | 1 | — | — | 9600 | 1 |
| normalized symbol error rate | 70 or smaller* | 80 to 110 | 80 to 110 | 80 to 110 | 9600 | 1 |
| path metric amount | 1800 or smaller* | 3200 to 3800 | 3000 to 3300 | 1800 to 2200 | 9600 | 1 |
| CRC | 1 | 0 | — | — | 4800 | 1 |
| normalized symbol error rate | 80 to 110 | 70 or smaller* | 80 to 110 | 80 to 110 | 4800 | 1 |
| path metric amount | 1500 to 2000 | 2500 or smaller | 2300 to 2900 | 1500 to 2000 | 4800 | 1 |
| CRC | 1 | 1 | — | — | 2400 | 1 |
| normalized symbol error rate | 80 to 120 | 75 to 110 | 70 or smaller* | 80 to 120 | 2400 | 1 |
| path metric amount | 1800 to 2200 | 2100 to 2800 | 2400 or smaller | 1300 to 1800 | 2400 | 1 |
| CRC | 1 | 1 | — | — | 1200 | 1 |
| normalized symbol error rate | 80 to 120 | 70 to 100 | 70 to 100 | 70 or smaller* | 1200 | 1 |
| path metric amount | 1900 to 2300 | 2500 to 3100 | 2000 to 2600 | 1700 or smaller | 1200 | 1 |

CRC is "0" if no error is detected and "1" if an error is detected.
*represents the value smaller than the threshold value and which is also the minimum value of decoded four rates

TABLE 2

Threshold value (estimated Eb/NO = +2(dB)) obtained when data rate of reliability 2 is decided

| Eb/NO = +2(dB) | parameter of decoded data 9600 (bps) | parameter of decoded data 4800 (bps) | parameter of decoded data 2400 (bps) | parameter of decoded data 1200 (bps) | decided data rate (bps) | reliability |
|---|---|---|---|---|---|---|
| CRC | 0 | 1 | — | — | 9600 | 2 |
| normalized symbol error rate | 75 or smaller* | 75 to 120 | 75 to 120 | 75 to 120 | 9600 | 2 |
| path metric amount | 2000 or smaller | 3000 to 4100 | 2700 to 3700 | 1500 to 2500 | 9600 | 2 |
| CRC | 1 | 0 | — | — | 4800 | 2 |
| normalized symbol error rate | 75 to 120 | 75 or smaller* | 75 to 120 | 75 to 120 | 4800 | 2 |
| path metric | 1300 to 2300 | 2700 or smaller | 2000 to 3100 | 1200 to 2300 | 4800 | 2 |

TABLE 2-continued

Threshold value (estimated Eb/NO = +2(dB)) obtained when data rate of reliability 2 is decided

| Eb/NO = +2(dB) | parameter of decoded data 9600 (bps) | parameter of decoded data 4800 (bps) | parameter of decoded data 2400 (bps) | parameter of decoded data 1200 (bps) | decided data rate (bps) | reliability |
|---|---|---|---|---|---|---|
| amount |  |  |  |  |  |  |
| CRC | 1 | 1 | — | — | 2400 | 2 |
| normalized symbol error rate | 75 to 120 | 75 to 120 | 75 or smaller* | 75 to 120 | 2400 | 2 |
| path metric amount | 1600 to 2300 | 2100 to 3100 | 2500 or smaller | 1000 to 2000 | 2400 | 2 |
| CRC | 1 | 1 | — | — | 1200 | 2 |
| normalized symbol error rate | 80 to 120 | 70 to 110 | 70 to 110 | 80 or smaller | 1200 | 2 |
| path metric amount | 1800 to 2500 | 2300 to 3500 | 1800 to 3000 | 1800 or smaller* | 1200 | 2 |

CRC is "0" if no error is detected and "1" if an error is detected.
*represents the value smaller than the threshold value and which is also the minimum value of decoded four rates.

Then, the decoding is changed from the sync. channel to the traffic channel. When the data of the traffic channel is decoded successfully, the channel control signal representing that the data of the traffic channel is received is input from the reception circuit to the channel selector 11. The channel selector 11 supplies data indicative of the traffic channel processing to the Viterbi decoder unit 1 and the data rate decision unit 10.

Then, the Viterbi decoder unit 1 memorizes modulation symbol input thereto at every frame in an input buffer memory incorporated therein, and decodes data at the data rate of 9600 bps, 4800 bps, 2400 bps and 1200 bps, in that order. The Viterbi decoder unit 1 outputs resultant decoded data to the CRC error detection unit 3, the convolutional coder 5 and the decoded data memory unit 9 and also outputs the path metric amount of the most likelihood path obtained at every decoding of 1 bit to the path metric amount memory unit 8 in the order of the decoded data rate so that the above path metric amount is memorized in the path metric amount memory unit 8.

The hard decision symbol memory unit 2 decides received symbol from the modulation symbol input thereto at the same timing as that of the Viterbi decoder unit 1 in a hard decision manner in the sequential order of 9600 bps, 4800 bps, 2400 bps and 1200 bps, for example, and memorizes the decided result. The convolutional coder 5 codes again decoded data decoded and output from the Viterbi decoder unit 1 in the assumed data rate of 9600 bps, 4800 bps, 2400 bps and 1200 bps, in that order while resetting the internal state at every data rate. Then, the convolutional coder 5 outputs encode symbol to the symbol error rate calculation unit 6.

The symbol error rate calculation unit 6 is supplied with the received symbol memorized in the hard decision symbol memory unit 2 and the encode symbol corresponding to the received symbol from the convolutional coder 5 at the same timing and performs the calculation of the logical exclusive-OR of the received symbol and the encode symbol in the sequential order of 9600 bps, 4800 bps, 2400 bps and 1200 bps. Then, the symbol error rate calculation unit 6 increments the count value of its incorporated counter by 1 if the calculated result is "1" and leaves the count value as it is if the calculated result is "0" at every frame in the sequential order of 9600 bps, 4800 bps, 2400 bps and 1200 bps while resetting the counter each time the data rate is changed. The symbol error rate calculation unit 6 outputs the calculated result to the symbol error rate memory unit 7 at every data rate and then resets its incorporated counter.

The CRC error detection unit 3 effects the CRC calculation on the decoded data of the data rate added with the CRC code output from the Viterbi decoder unit 1, i.e., decoded data of 9600 bps and 4800 bps. Then, the CRC error detection unit 3 outputs a calculated result of "0" to the CRC memory unit 4 if an error is not detected and a calculated result of "1" to the CRC memory unit 4 if an error is detected. The CRC memory unit 4 temporarily memorizes the calculated result (CRC calculated result) supplied thereto from the CRC error detection unit 3.

The data rate decision unit 10 (FIG. 3) is supplied with CRC calculated results of 9600 bps and 4800 bps memorized in the CRC memory unit 4, the symbol error rates of 9600 bps, 4800 bps, 2400 bps, 1200 bps memorized in the symbol error rate memory unit 7 and path metric amounts of 9600 bps, 4800 bps, 2400 bps, 1200 bps memorized in the path metric memory unit 8.

The CRC calculated result is input to the comparison unit 24 as it is, as shown in FIG. 3. The symbol error rate is normalized by the normalization calculation unit 21 as a normalized symbol error rate. The path metric amount is averaged by the averaging and calculating unit 22 as the path metric amount average value and is then output to the comparison unit 24 and the Eb/NO estimation unit 26.

Figure 9:
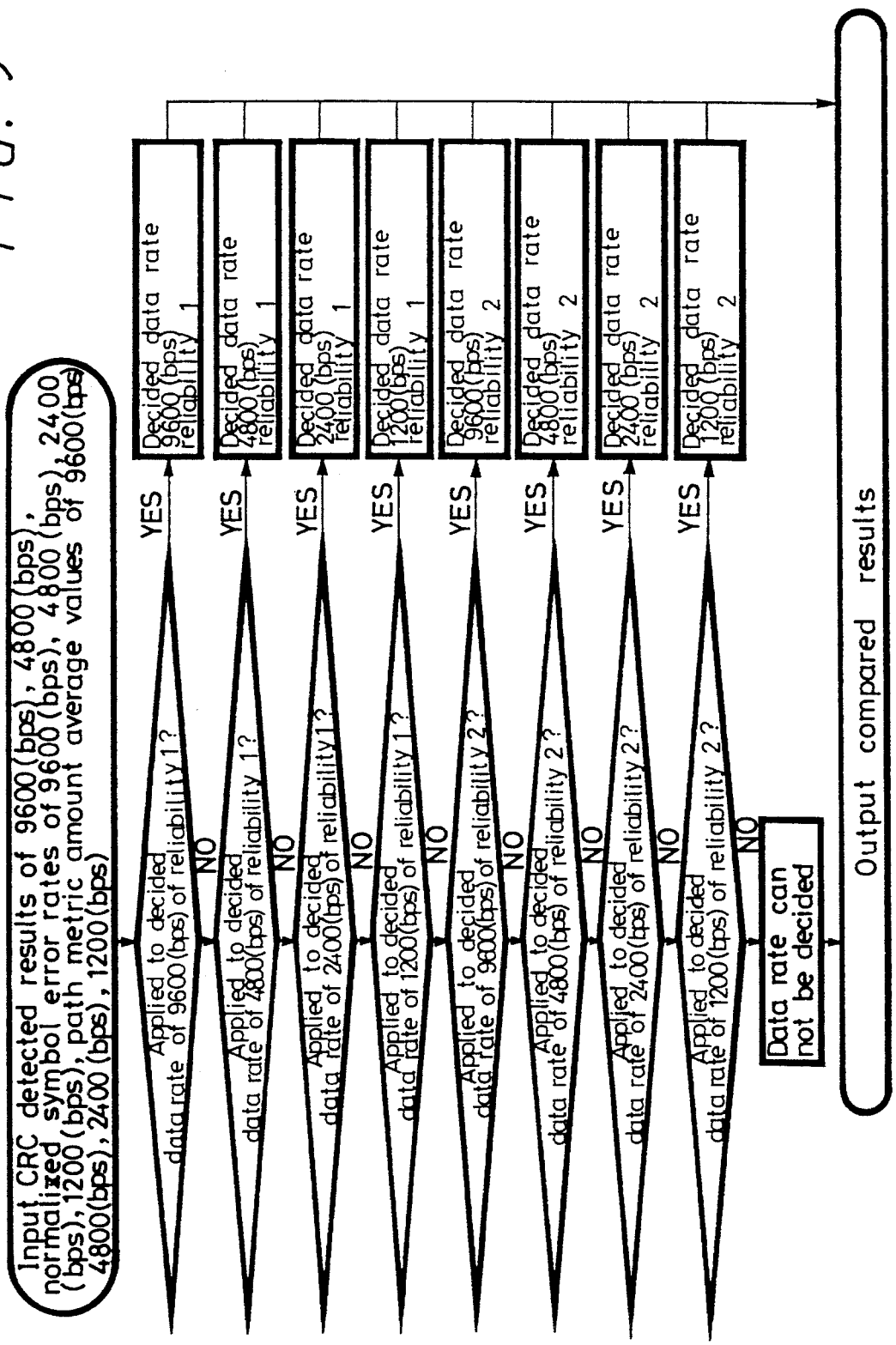
FIG. 9 is a flowchart to which reference will be made in explaining operation of a comparison unit shown in FIG. 3.

Operation of the comparison unit 24 will be described with reference to a flowchart of FIG. 9. As shown in FIG. 9, the comparison unit 24 compares CRC calculated results of 9600 bps, 4800 bps, the normalized symbol error rates and the path metric amount average values of 9600 bps, 4800 bps, 2400 bps, 1200 bps with the threshold values shown on the tables 1 and 2 in the sequential order of the threshold value of the decided data rate of 9600 bps having the reliability 1 shown on the table 1 and the threshold values of the decided data rate of 1200 bps having the reliability 2 shown on the table 2. Then, the comparison unit 24 outputs the reliability and the decided data rate in which all compared results become true to the decision unit 25 and the Eb/NO estimation unit 26.

Specifically, the comparison unit 24 decides the data rate as 9600 bps and outputs the reliability of value 1 if the CRC calculated results of 9600 bps and 4800 bps are "0" and "1" when the normalized symbol error rates of 9600 bps, 4800 bps, 2400 bps and 1200 bps are respectively 70 or smaller and lie in a range of from 80 to 110, lie in a range of from 80 to 110 and also lie in a range of from 80 to 110, the normalized symbol error rate of 9600 bps is the minimum value, the path metric amount average values of 9600 bps, 4800 bps, 2400 bps and 1200 bps are 800 or smaller, lie in a range of from 3200 to 3800, lie in a range of from 3000 to 3300, lie in a range of from 1800 to 2200, and when the path metric amount average value of 9600 bps is the minimum value (i.e., when the conditions of the uppermost row of the table 1 all become true).

The comparison unit 24 decides the data rate as 1200 bps and outputs the reliability of value 2 (conditions on the lowermost row of the table 2 all become true) if the CRC calculated results of 9600 bps and 4800 bps are "1" and "1", when the normalized symbol error rates of 9600 bps, 4800 bps, 2400 bps and 1200 bps fall in a range of from 80 to 120, fall in a range of from 70 to 110, fall in a range of from 70 to 110 and are 80 or smaller and the path metric amount average values of 9600 bps, 4800 bps, 2400 bps and 1200 bps fall in a range of from 1800 to 2500, fall in a range of from 2300 to 3500, fall in a range of from 1800 to 3000 and are 1800 or smaller.

The comparison unit 24 outputs a data rate decision impossible signal representative of the fact that the data rate cannot be decided if it is determined that there are no reliability and decision data rate in which compared results all become true.

If the decided data rates output from the comparison unit 24 are 9600 bps, 4800 bps, 2400 bps and 1200 bps, the Eb/NO estimation unit 26 estimates the Eb/NO value from the normalized symbol error rates and the path metric average value on the basis of the dashed line portions (stored in the Eb/NO estimation unit 26) shown in FIGS. 4 through 7 and outputs the estimated Eb/NO value to the decision unit 25.

The decision unit 25 determines (decides) a final reliability from the reliability output from the comparison unit 24 and the Eb/NO value output from the Eb/NO estimation unit 26, and outputs the final reliability thus determined to the decoded data memory unit 9 together with the decided data rate output from the comparison unit 24.

Specifically, the decision unit 25 changes the reliability 1 supplied thereto from the comparison unit 24 into the reliability 2 and the reliability 2 into the reliability 3 if the value of Eb/NO estimated by the Eb/NO estimation unit 26 is lower than +2 dB, for example. If the value of Eb/NO is higher than +2 dB, the decision unit 25 outputs the reliability supplied thereto from the comparison unit 24 as it is.

The data rate (decided data rate) and the reliability output from the decision unit 25 are supplied to the decoded data memory unit 9 (FIG. 1). The decoded data memory unit 9 outputs decoded data decoded at the same assumed data rate of the decided data rate supplied thereto from the data rate decision unit 10 (decision unit 25) from the decoded data of one frame decoded at the assumed data rates of 9600 bps, 4800 bps, 2400 bps and 1200 bps output from the Viterbi decoder unit 1 as accurate decoded data of one frame. Further, the decoded data memory unit 9 outputs the reliability of the data rate supplied thereto from the data rate decision unit 10.

The decoded data memory unit 9 does not output decoded data but outputs a signal representative of the fact that the data rate cannot be decided when the data rate decision unit 10 outputs the data rate decision impossible signal.

The reliability of the data rate decided result can be used in order to reduce an erroneous decision of data rate even when the decision impossible case is increased. Specifically, when the reliability is 3, for example, the decoded data is not output to the decoded data memory unit 9 and the decision impossible signal is output to the decoded data memory unit 9, thereby reducing the erroneous decision of the data rate.

As described above, according to the above decoding apparatus of the present invention, it is possible to accurately and satisfactorily determine a decoding data rate by deciding the data rate provided at every unknown frame of the traffic channel with a simple arrangement.

The mobile radio communication system shown in FIG. 1 decodes convolutional symbols with different data rates processed by the same convolutional code at every frame in the same channel as in the traffic channel of the CDMA system and decides the data rates. Also, this mobile radio communication system decodes a variable data rate such that decoded data is output at the frame unit and uses the three of (1) CRC calculated result, (2) symbol error rate, (3) path metric amount as parameters to decide data rate and determine reliability.

This mobile radio communication system decodes symbols and calculates (1) to (3) at every frame with respect to all data that can be transmitted. Also, the mobile radio communication system memorizes all decoded data and compares the previously-set data rate and the threshold value corresponding to the reliability by normalizing (2) and averaging (3) on the basis of the calculated results of (1) to (3).

In this case, the date rate and the reliability are sequentially compared with the threshold values ranging from threshold values having high reliability for high data rate to threshold values for low data rate. Then, the data rate and the reliability are compared with threshold values ranging from threshold value having a lower reliability for high data rate to threshold values with respect to low data rate. If a correct threshold value is detected, then the data rate and the reliability corresponding to the threshold value are used as arguments and the comparison is ended. With respect to reliability, when the Eb/NO value estimated from the symbol error rate and the path metric amount of the decided data rate is worse than the Eb/NO value estimated when the threshold value is set, reliability is lowered by one rank and the decision of data rate is ended. Then, the decoded data of the determined reliability and the decided data rate is output at every frame.

As described above, since the data rate decision and the reliability are obtained from the CRC calculated results, the symbol error rates and the path metric amounts with respect to all data rates that could be transmitted, it is possible to reduce the probability that the erroneous decision will be carried out. Further, since the threshold value is set on the basis of the Eb/NO estimated from the symbol error rate of the sync. channel provided immediately before the sync.

channel is changed to the traffic channel and the path metric amount, the threshold value can be set in the stable channel, such as the WGN channel or the like, in accordance with the situation of the channel.

The final reliability is determined by the Eb/NO estimated from the symbol error rate of the decided data rate and the path metric amount. When the Eb/NO estimated from the symbol error rate of the decided data rate and the path metric amount is worse than the Eb/NO of the set threshold value, the reliability is lowered. Therefore, taking these facts into consideration, it is possible to increase the possibility of the reliability.

Further, the comparison is carried out in the sequential order of threshold values for high data rate of high reliability to low data rate. Then, the comparison is carried out similarly under the condition that reliability is lowered by one rank. When a suitable threshold value is detected, data rate and reliability corresponding to the suitable threshold value are used as arguments and the comparison is ended. Therefore, if the present Eb/No value is higher than the Eb/No value estimated when the threshold value is set, then the comparison need not be carried out for all cases and a load put on the decoding apparatus can be reduced, accordingly.

Further, since the average value of only the path metric amount of the effective most likelihood path of the decoded data decoded at the frame unit is calculated as shown in FIG. 8 when the average value of the path metric amount is calculated, the reliability of the obtained average value is increased and a ratio with which the data rate will erroneously be decided can be reduced.

In the above-mentioned Viterbi decoding apparatus, specifications of the sync channel and the traffic channel are determined as shown on the following table 3.

A punctured symbol is generated at continuous two modulation symbols of every 24 modulation symbols only in the traffic channel. The punctured symbol is information that is used to increase or decrease (up-down) a transmission electric power of the reception side. The punctured symbol is transmitted together with audio information. Then, in the received modulation symbol, the punctured symbol is decided by a circuit (not shown) provided at the front stage of the Viterbi decoder unit 1. A modulation symbol that was decided as the punctured symbol is not decided in 6 bits, for example, in a soft decision fashion but is set to 0. Accordingly, the punctured symbol may be extracted when the value of the received symbol is 0.

Calculation of the normalized symbol error rate in the normalization calculation unit 21 (FIG. 3) is carried out as follows (only any of 9600 bps, 4800 bps and 2400 bps is calculated in the sync channel).

The normalized symbol error rate of 9600 bps=(symbol error rate of 9600 bps calculated by the symbol error rate calculation unit 6)×1

The normalized symbol error rate of 4800 bps=(symbol error rate of 4800 bps calculated by the symbol error rate calculation unit 6)×2

The normalized symbol error rate of 2400 bps=(symbol error rate of 2400 bps calculated by the symbol error rate calculation unit 6)×4

The normalized symbol error rate of 1200 bps=(symbol error rate of 1200 bps calculated by the symbol error rate calculation unit 6)×8   (1)

In the equation (1), 1, 2, 4 and 8 are used to match the bits with 192 bits obtained when the data rate is 9600 bps.

TABLE 3 specification of sync. channel and traffic channel

| | data rate (bps) | frame length (msec) | number of data in one frame | number of encode symbols in one frame | number of modulation symbols in one frame | repeated number in one frame |
|---|---|---|---|---|---|---|
| sync. channel | 9600 | 20 | 192 | 384 | 384 | 1 |
| | 4800 | | 96 | 192 | | 2 |
| | 2400 | | 48 | 96 | | 4 |
| traffic channel | 9600 | 20 | 192 | 384 | 384 | 1 |
| | 4800 | | 96 | 192 | | 2 |
| | 2400 | | 48 | 96 | | 4 |
| | 1200 | | 24 | 48 | | 8 |

*The number of data of traffic channel is a value including CRC and tail bit.
*The received modulation symbol is decided in a 6-bit soft decision fashion and input to the Viterbi decoder unit 1.
*The repeated number corresponds to the modulation symbol number/encode symbol number.

On the table 3, the modulation symbol might be a convolutional coded received symbol when the data rate is 9600 bps; the modulation symbol might be such one that results from repeating the convolutional coded symbol value twice if the data rate is 4800 bps; the modulation symbol might be such one that results from repeating the convolutional coded symbol value four times if the data rate is 2400 bps; and the modulation symbol might be such one that results from repeating the convolutional codes symbol value eight times if the data rate is 1200 bps. Therefore, when decoding data of one frame, it is sufficient for the input buffer memory (not shown) incorporated in the Viterbi decoder unit 1 to memorize 384 modulation symbols (one frame amount) independently of the data rate.

The path metric amount average value is calculated by the average value calculation unit 22 (FIG. 3) by using the hatched portion shown in FIG. 8 as follows (path memory length incorporated within the Viterbi decoder unit 1 is selected to be 64):

In the case of 9600 bps (data bit rate of one frame>path memory length), path metric amount average value=(sum total of path metric amount of most likelihood path corresponding to first decoded data 128 (=192−64) bits of frame)/128

In the case of 4800 bps (data bit rate of one frame>path memory length), path metric amount average value=(sum total of path metric amount of most likelihood path corresponding to first decoded data 32 (=96−64) bits of one frame)/32

In the case of 2400 bps (data bit rate of one frame<path memory length), path metric amount average value=(path metric amount of most likelihood path corresponding to one bit of first decoded data of frame)

In the case of 1200 bps (data bit rate of one frame path memory length), path metric amount average value=(path metric amount of most likelihood path corresponding to one bit of first decoded data of frame)     (2)

A second embodiment of the present invention will be described below.

In the first embodiment, the normalized symbol error rate calculation equation (shown in the equation (1)) in the normalization calculation unit 21 (FIG. 3) does not take the punctured symbol into consideration so that an error occurs in the normalized symbol error rate. There is then the risk that the data rate decision rate will be degraded a little.

Further, there can be considered the probabilities, such as when an error that cannot be detected occurred in data, when the CRC calculated result of data of 9600 bps become equal to the CRC calculated result of data of 4800 bps and when the CRC calculates result of data of 4800 bps become equal to CRC calculated result of data of 9600 bps. Further, there can be considered the probability that an erroneous CRC calculated result or CRC calculated result becomes equal to CRC calculated results of data of both 9600 bps and 4800 bps.

When the CRC calculated result is erroneous as described above, a correct data rate cannot be decided on the basis of the threshold value tables in which the CRC calculated results shown in the tables 1 and 2 are decided as absolute results.

Figure 10:
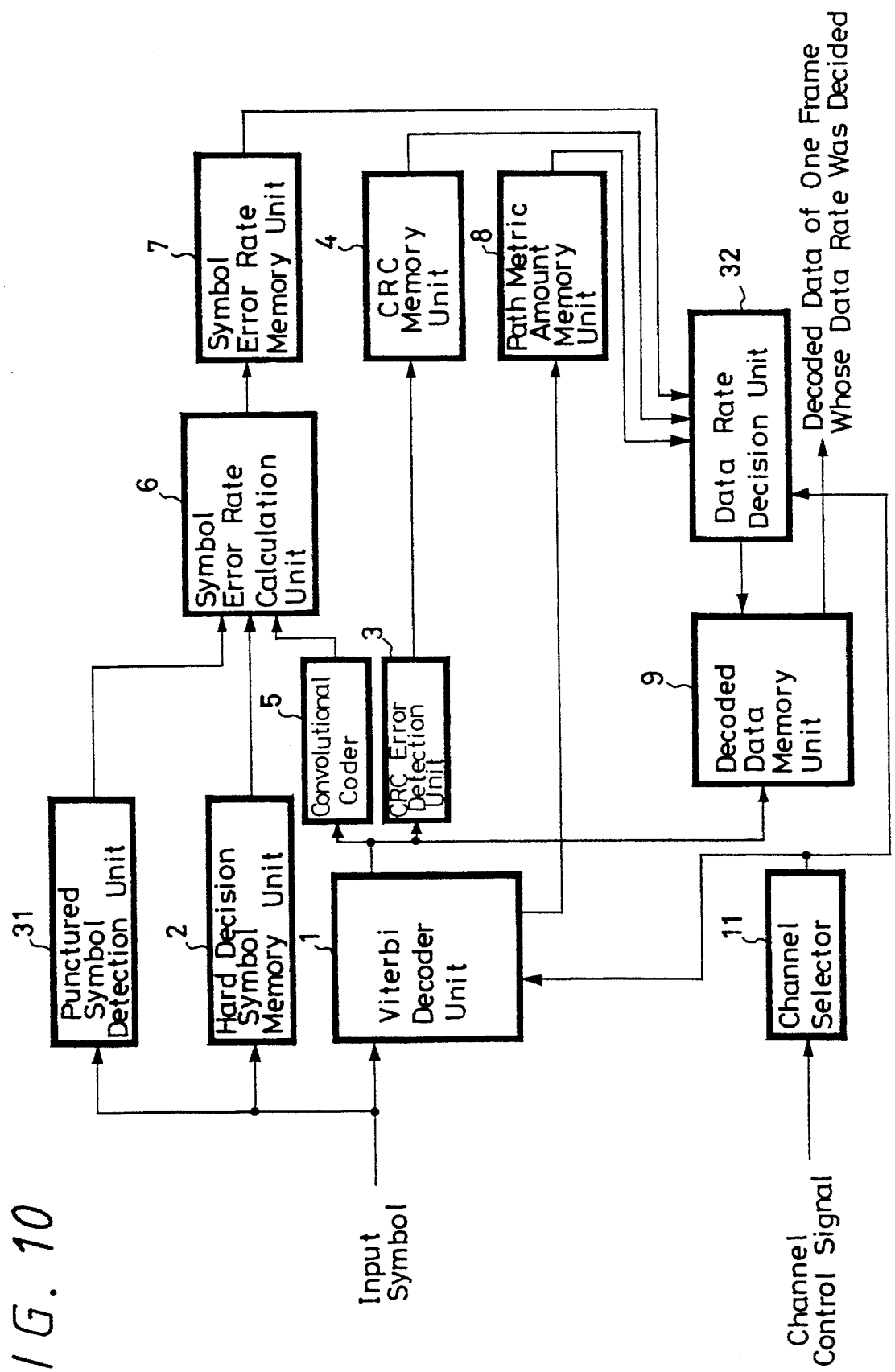
FIG. 10 is a block diagram showing a second embodiment of a mobile radio set to which the decoding apparatus according to the present invention is applied.

FIG. 10 is a block diagram showing a circuit arrangement of a second embodiment of the mobile radio set to which the decoding apparatus of the present invention is applied. In FIG. 10, like parts corresponding to those of FIG. 1 are marked with the same references.

The mobile radio communication system according to the second embodiment is different from the mobile radio communication system shown in FIG. 1 only in that the data rate decision unit 10 is replaced with a data rate decision unit 32 and that a punctured symbol detection unit 31 is newly provided.

The punctured symbol detection unit 31 detects a punctured symbol (i.e., punctured symbol which is not decided in 6 bits, for example, in a soft decision fashion but set to 0) from the input modulation symbols. The symbol error rate calculation unit 6 is controlled so as to exclude the symbol corresponding to the detected punctured symbol from the symbol error count object. Accordingly, the symbol error rate calculation unit 6 counts a symbol error except the symbol corresponding to the punctured symbol detected by the punctured symbol detection unit 31.

Figure 11:
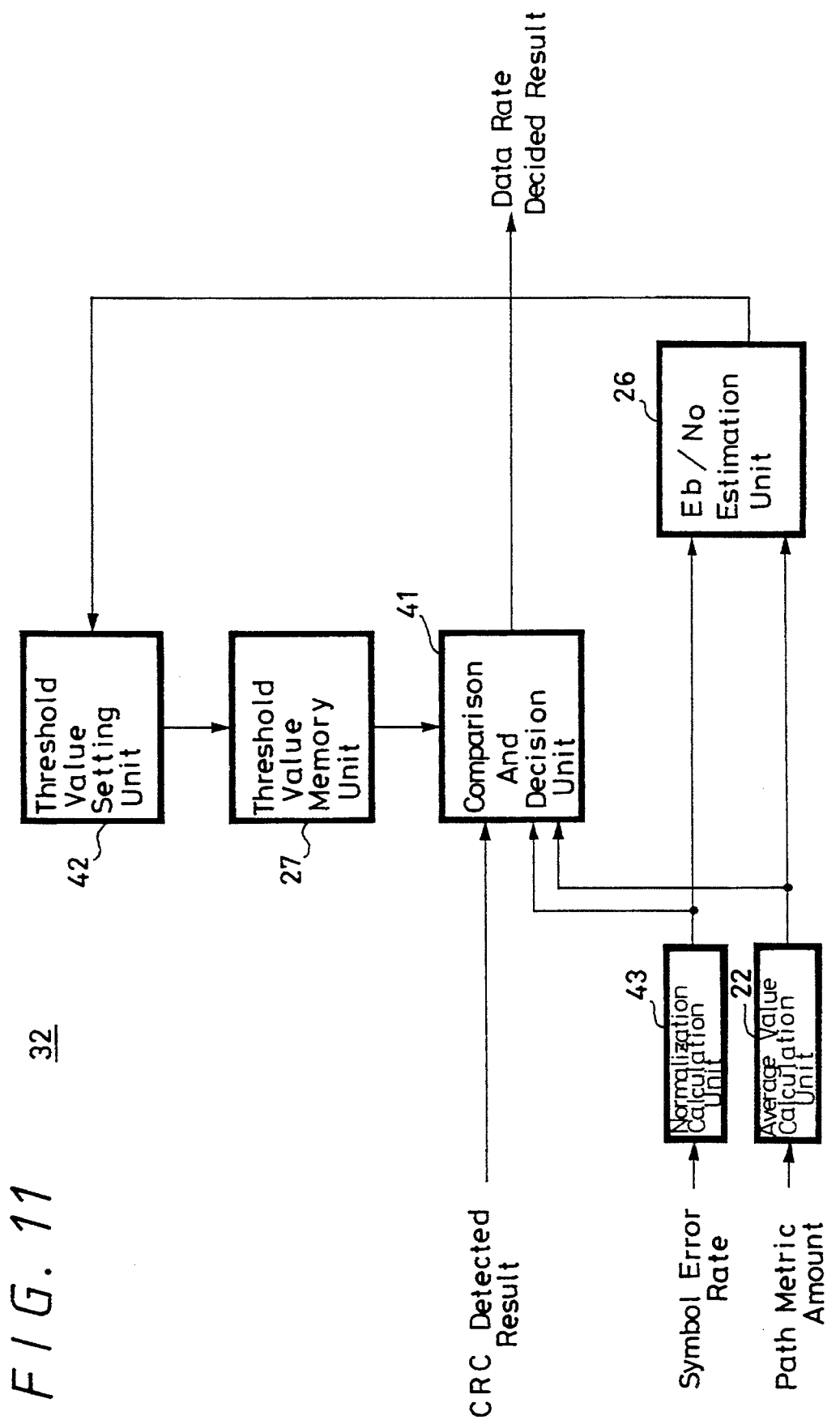
FIG. 11 is a block diagram showing a data rate decision unit according to the second embodiment shown in FIG. 10 more in detail.

A date rate decision unit 32 is arranged as shown in FIG. 11. In FIG. 11, like parts corresponding to those of FIG. 3 are marked with the same references. Accordingly, the data rate decision unit 32 in FIG. 11 is different from the data rate decision unit 32 shown in FIG. 3 only in that the normalization calculation unit 21, the threshold value setting unit 23 or the comparison unit 24 are replaced with a normalization calculation unit 43, a threshold value setting unit 42 or a comparison and decision unit 41 and that the decision unit 25 shown in FIG. 3 is removed.

The normalization calculation unit 43 calculates normalized symbol error rates from the symbol error rates of bps, 4800 bps, 2400 bps and 1200 bps memorized in the symbol error rate memory unit 7 shown in FIG. 10 in accordance with the following equations in which the punctured symbols are taken into consideration.

Normalized symbol error rate of 9600 bps=(symbol error rate of 9600 bps calculated by the symbol error rate calculation unit 6)×1×(11/12)×(172/192)

Normalized symbol error rate of 4800 bps=(symbol error rate of 4800 bps calculated by the symbol error rate calculation unit 6)×2×(11/12)×(80/96)

Normalized symbol error rate of 2400 bps=(symbol error rate of 2400 bps calculated by the symbol error rate calculation unit 6)×4×(11/12)×(40/48)

Normalized symbol error rate of 1200 bps=(symbol error rate of 1200 bps calculated by the symbol error rate calculation unit 6)×8×(11/12)×(16/24)     (3)

In the equation (3), 11/12(=(24−2)/24) is a coefficient used to compensate an influence of punctured symbols of 2 symbols of the above-mentioned 24 symbols. Further, 172/192, 80/96, 40/48 and 16/24 are respectively coefficients used to compensate an influence of CRC code or tail bit of one frame data of 9600 bps, 4800 bps, 2400 bps and 1200 bps (to convert the symbol error rate calculated by the symbol error rate calculation unit 6 into symbol error rate of bits representing substantial information).

When the sync channel data is received, similarly to the first embodiment, the normalized symbol error rate calculated by the normalization calculation unit 43 is output to the Eb/NO estimation unit 26 together with the path metric amount average value calculated by the average value calculation unit 22. The Eb/NO estimation unit 26 estimates an Eb/NO value from the normalized symbol error rate and the path metric average value on the basis of any one of experimental results (shown in FIGS. 4 through 7) corresponding to the fixed data rates of the sync channel. The Eb/No value thus estimated is output to the threshold value setting unit 42 from the Eb/NO estimation unit 26.

The threshold value setting unit 42 memorizes therein threshold value tables in which threshold values of the path metric amount average values and the normalized symbol error rates in which dates rates of traffic channels can be regarded as 9600 bps, 4800 bps, 2400 bps and 1200 bps are described and which are classified in response to the Eb/NO value on the basis of the experimental results shown in FIGS. 4 through 7. The threshold value tables memorized in the threshold value setting unit 42 do not take the CRC calculated result of the CRC error detection unit 3 unlike the threshold value table of the threshold value setting unit 23 according to the first embodiment.

When the threshold value setting unit 42 receives the Eb/NO from the Eb/NO estimation unit 26, the threshold value setting unit 42 outputs the threshold value table corresponding to the Eb/NO value thus received to the threshold value memory unit 27 so that this threshold value table is memorized in the threshold value memory unit 27 (threshold value table is set in the threshold value memory unit 27).

The above-mentioned operation is carried out during the sync channel data is received.

When the Eb/NO output from the Eb/NO estimation unit was +3 dB, an examples of the threshold table set in the threshold value memory unit 27 from the threshold value setting unit 42 is illustrated on the following table 4.

TABLE 4

Example of traffic channel data rate decision threshold table (obtained when EB/NO = +3dB)

| Number of threshold value set | Data rate to be decided | Summary of conditions and threshold values | reliability |
|---|---|---|---|
| 1 | 9600 bps | of normalized symbol error rates of 4 rates, 9600 bps is the minimum value Normalized symbol error rate of 9600 bps <40 Of path metric amount average values of 4 rates, 9600 bps is the minimum | 1 |
| 2 | 9600 bps | Of normalized symbol error rates of 4 rates, 9600 bps is the minimum value Normalized symbol error of 9600 bps <40 | 2 |
| 3 | 4800 bps | Of normalized symbol error rates of 4 rates, 9600 bps is the minimum value Normalized symbol error rates of 4800 bps <45 | |
| 4 | 2400 bps | Normalized symbol error rates of 2400 bps <45 Path metric amount average value of 2400 bps <2150 Path metric amount average value of 1200 bps >1300 | 1 |
| 5 | 1200 bps | Normalized symbol error rates of 1200 bps <65 Path metric amount average value of 1200 bps <1550 Path metric amount average value >1900 | 1 |

Thereafter, the sync channel is switched to the traffic channel. When the traffic channel data is demodulated successfully, similarly to the first embodiment, the Viterbi decoder unit 1 (FIG. 10) starts decoding modulation symbols of the traffic channels input at every frame in the assumed data rates of 9600 bps, 4800 bps, 2400 bps and 1200 bps, in that order. Therefore, the data rate decision unit 32 is supplied with CRC calculated results of 9600 bps, 4800 bps memorized in the CRC memory unit 4, symbol error rates of 9600 bps, 4800 bps, bps, 1200 bps counted except the symbol corresponding to the punctured symbol and which are memorized in the symbol error rate memory unit

7 and path metric amounts of 9600 bps, 4800 bps, 2400 bps, 1200 bps memorized in the path metric amount memory unit 8.

In the data rate decision unit 32, the CRC calculated result is input to the comparison and decision unit 41 as it is. Then, the symbol error rate is normalized as the normalized symbol error rate by the normalization and calculation unit 43 in accordance with the equation (3). Also, the path metric amount is averaged as the path metric amount average value by the averaging and calculation unit 22 and then output to the comparison and decision unit 41.

Figure 12:
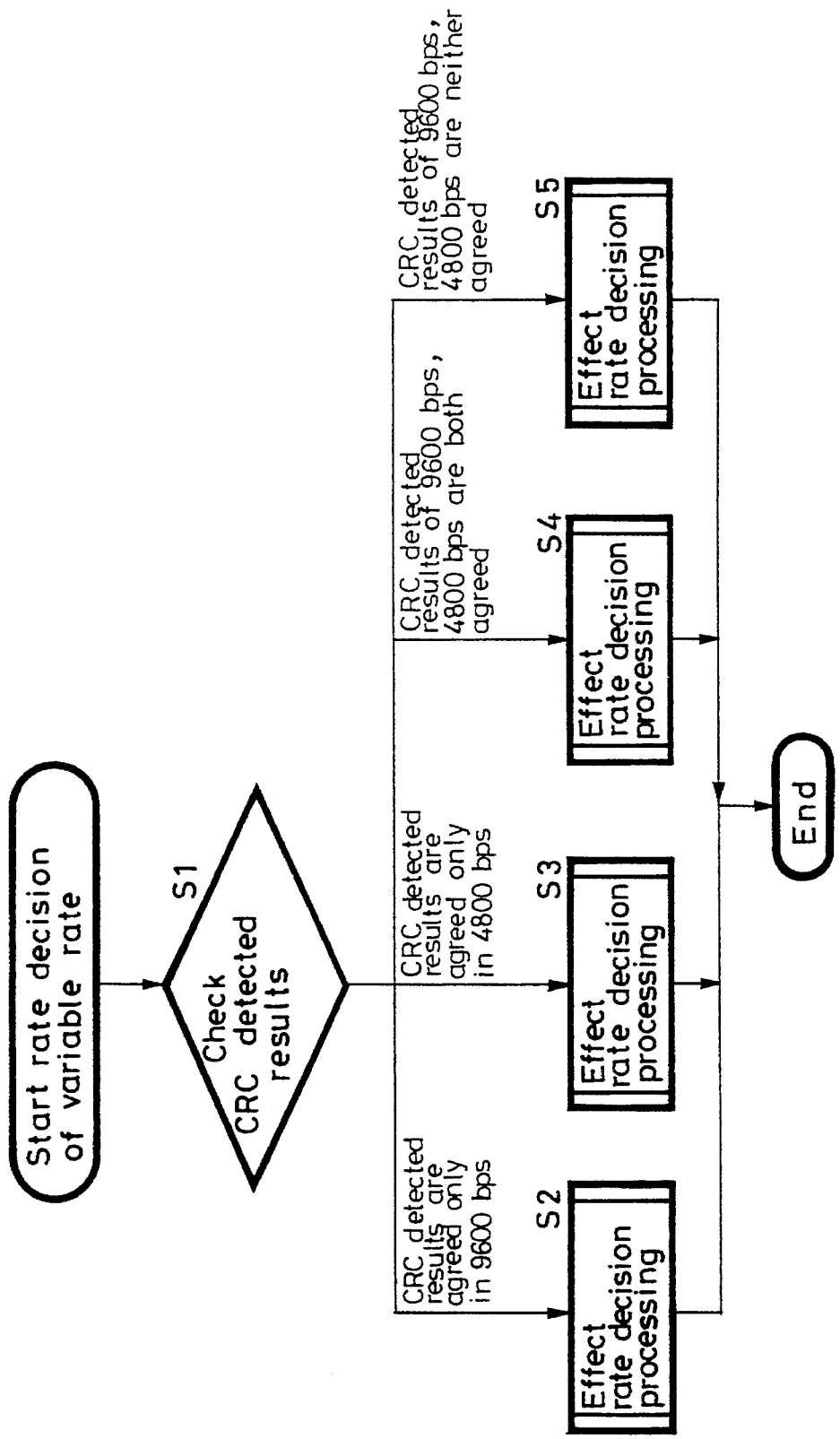
FIG. 12 is a flowchart to which reference will be made in explaining operation of a comparison and decision unit shown in FIG. 11.

The comparison and decision unit 41 performs the processing in accordance with a flowchart shown in FIG. 12. Specifically, as shown in FIG. 12, following the start of operation, it is determined at decision step S1 whether or not CRC calculated result (CRC detected result) is correct. If it is determined that the CRC calculated result is correct only in the 9600 bps, then the rate decision processing in step S2 is executed.

If it is determined at decision step S1 that the CRC calculated result is correct only in the 4800 bps, then the rate decision processing in step S3 is executed. If it is determined at decision step S1 that the CRC calculated result is correct both in the 9600 bps and 4800 bps, then a rate decision processing in step S4 is executed. If it is determined that the CRC calculated result is not correct both in the 9600 bps and 4800 bps, then a rate decision processing in step S5 is executed.

In the rate decision processings shown in the steps S2 through S5, the normalized symbol error rates, the path metric amount average values of 9600 bps, 4800 bps, 2400 bps and 1200 bps are compared with the threshold values (threshold value sets) of the threshold value table shown in the table 4 in the sequential order based on the CRC calculated results and the occurrence probabilities of data rates of the traffic channel. Then, reliability and decision data rate (data rate to be decided) in which compared results all become true are output.

Study of experimental results reveals that occurrence probabilities of data rates 9600 bps, 4800 bps, 2400 bps and 1200 bps of the traffic channel are approximately a little less than ⅜, a little less than ⅛, a little more than ⅛ and a little more than ⅜, respectively. Therefore, the occurrence probabilities of the data rate of the traffic channel become high in the sequential order of 1200 bps, 9600 bps, 2400 bps and 4800 bps.

Figure 13:
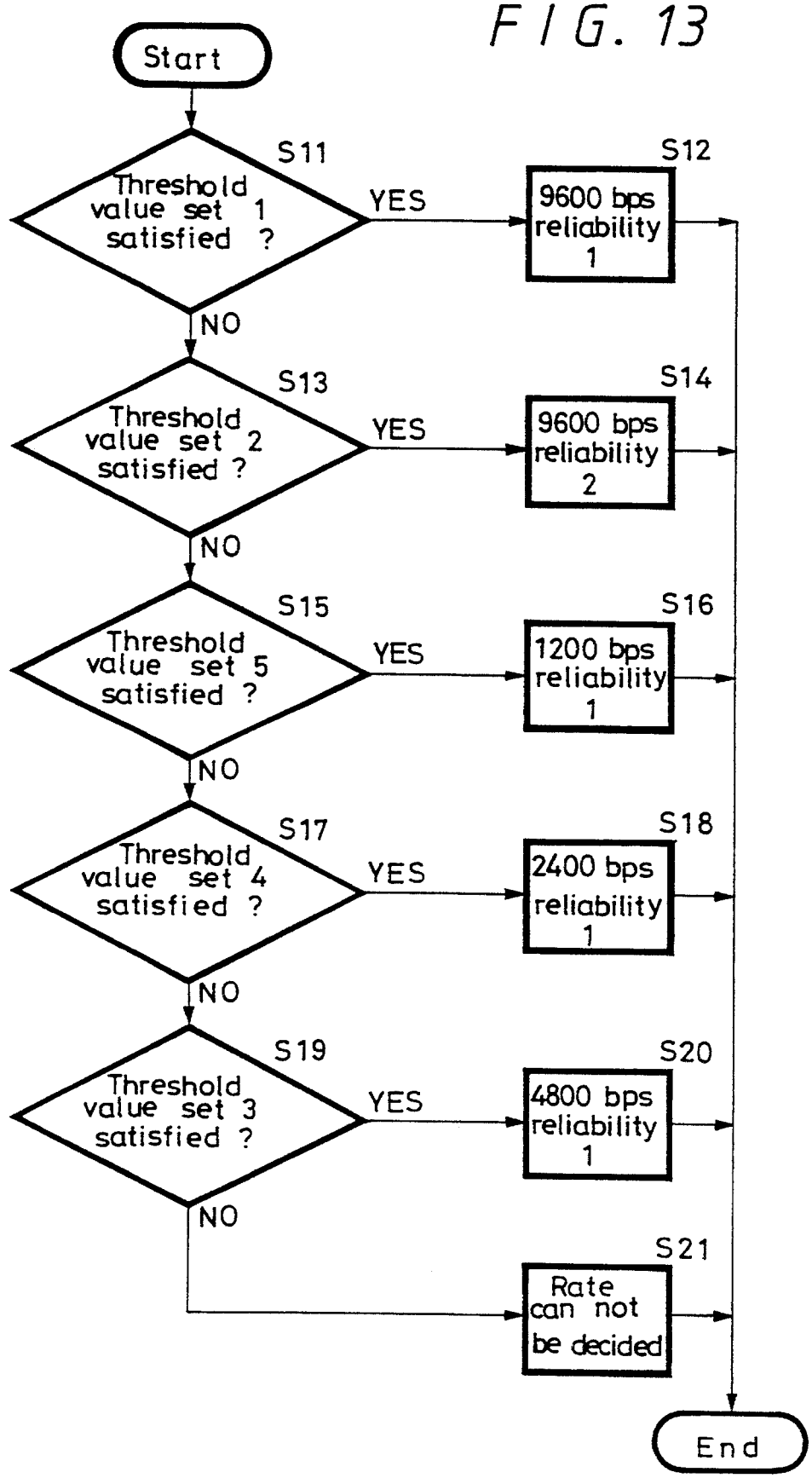
FIG. 13 is a flowchart to which reference will be made in explaining more in detail step S2 of the flowchart shown in FIG. 12.

Specifically, in the rate decision processing shown in step S2, of the threshold value sets of the threshold value table shown in the table 4 and memorized in the threshold value memory unit 27 (FIG. 11), a threshold value of a threshold value set of 9600 bps in which the CRC calculated result is correct and which is a threshold value set 1 having high reliability is compared with normalized symbol error rates and path metric amount average values of 4 data rates (9600 bps, 4800 bps, 2400 bps, 1200 bps) in step S11 shown in FIG. 13, If it is determined at decision step S11 that compared results of the threshold values of the threshold value set 1 and the normalized symbol error rates and the path metric amount average values of the 4 data rates are all true, or if the normalized symbol error rates of 9600 bps in those of 9600 bps, 4800 bps, 2400 bps and 1200 bps is minimum and smaller than 40 and the path metric amount average value of 9600 bps in those of 9600 bps, 4800 bps, 2400 bps and 1200 bps is minimum, then the processing proceeds to step S12, wherein it is determined that the data rate is 9600 bps and that a reliability thereof is 1. Then, the processing is ended.

If it is determined at decision step S11 that any of the compared results of the threshold values of the threshold value set 1 and the normalized symbol error rates and the path metric amount average values of the 4 data rates is not true, then the processing proceeds to step S13. In step S13, of the threshold value sets of the threshold value table shown in the table 4, the threshold value of the threshold value set 2 which is the threshold value set of 9600 bps in which the CRC calculated result is correct and whose reliability is the second highest is compared with the normalized symbol error rates and the path metric amount average values of the 4 data rates.

If it is determined at decision step S13 that compared results of the threshold values of the threshold value set 2 and the normalized symbol error rates and the path metric amount average values of the 4 data rates are all true, then the processing proceeds to step S14, wherein it is determined that the data rate is 9600 bps and that a reliability thereof is 2. Then, the processing is ended.

If it is determined at decision step S13 that any of the compared results of the threshold value of the threshold value set 1 and the normalized symbol error rates and the path metric amount average values of the 4 data rates is not true, or if any one of the threshold value sets 1 and 2 of 9600 bps in which the CRC calculated result is the correct data rate of the threshold values set of the threshold value table shown in the table 4 does not satisfy the normalized symbol error rates and the path metric amount average values of the 4 data rates, then the threshold value sets and the normalized symbol error rates and the path metric amount average values of the 4 data rate are compared in the following steps S15, S17, S19 in the sequential order of the occurrence probabilities of the data rate of the traffic channel.

Specifically, in step S15, the normalized symbol error rates and the path metric amount average values of the 4 data rates are compared with the threshold values of the threshold value set 5 of 1200 bps having the highest occurrence probability. If it is determined that compared results of the normalized symbol error rates and the path metric amount average values of the 4 data rates with the threshold values of the threshold value set 5 are all true, then the processing proceeds to step S16, wherein it is determined that the data rate is 1200 bps and that the reliability thereof is 1. Then, the processing is ended.

If it is determined that any of the compared results of the normalized symbol error rates and the path metric amount average values of the 4 data rates with the threshold values of the threshold set 5 is not true, then the processing proceeds to step S17. In step S17, the normalized symbol error rates and the path metric amount average values of the 4 data rates are compared with the threshold values of the threshold value set 4 of 2400 bps having the second highest probability next to 1200 bps (although data rate of 9600 bps has the highest occurrence probability next to the data rate of 1200 bps, in this case, the comparison of the threshold values of the threshold value sets 1 and 2 of 9600 bps with the normalized symbol error rates and the path metric amount average values was already finished, and therefore the threshold value set 4 of 2400 bps having the highest occurrence probability next to 9600 bps is used.). If compared results are all true, then the processing proceeds to step S18, whereat it is determined that the data rate is 2400 bps and that the reliability thereof is 1. Then, the processing is ended.

If it is determined in decision step S17 that any one of the compared results of the normalized symbol error rates and the path metric amount average values of the 4 data rates with the threshold values of the threshold value set 4 is not true, then the processing proceeds to step S19, wherein the normalized symbol error rates and the path metric amount average values of the 4 data rates are compared with threshold values of the threshold value set 3 of 4800 bps having the high occurrence probability next to 2400 bps. If compared results of the normalized symbol error rates and the path metric amount average values of the 4 data rates and the threshold values of the threshold value set 3 are all true, then the processing proceeds to step S20, wherein it is determined that the data rate is 4800 bps and that the reliability thereof is 1. Then, the processing is ended.

If any one of the compared results is not true, then the processing proceeds to step S21, wherein it is determined that the data rate cannot be decided. Then, the processing is ended.

Figure 14:
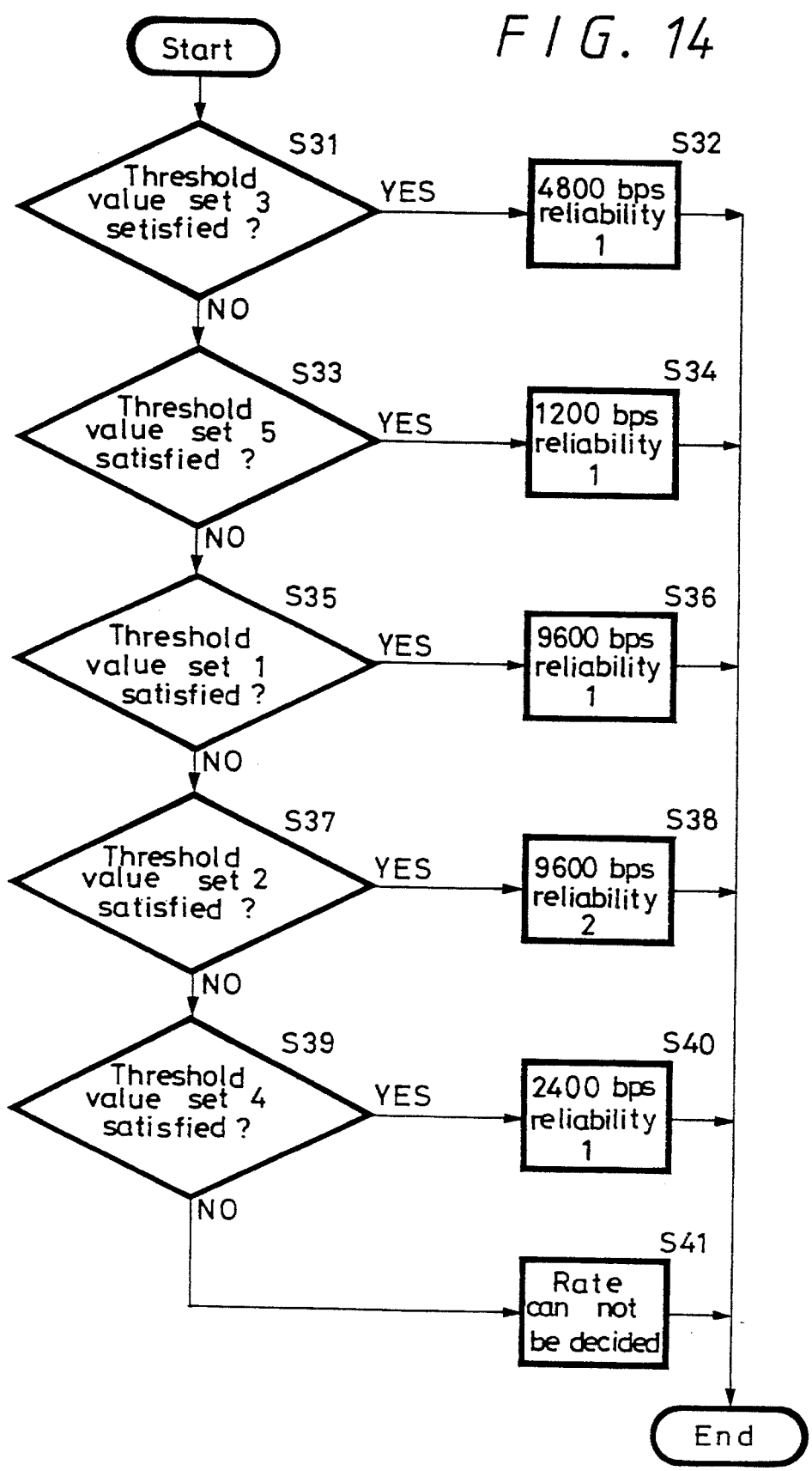
FIG. 14 is a flowchart to which reference will be made in explaining more in detail step S3 of the flowchart shown in FIG. 12.

Referring back to FIG. 12, the rate decision processing shown in step S3 will be described. In step S31 shown in FIG. 14, of the threshold value sets of the threshold value tables shown on the table 4 and memorized in the threshold value memory unit 27 (FIG. 11), the threshold values of the threshold value set 3 of 4800 bps having the correct CRC calculated result are compared with the normalized symbol error rates and the path metric amount average values of the four date rates (9600 bps, 4800 bps, 2400 bps and 1200 bps).

If it is determined at decision step S31 that the compared results of the threshold values of the threshold value set 3 with the normalized symbol error rates and the path metric amount average values of the 4 data rates are all true, then the processing proceeds to step S32. In step S32, it is determined that the data rate is 4800 bps and that the reliability thereof is 1. Then, the processing is ended.

If it is determined at decision step S31 that any one of the compared results of the threshold values of the threshold set 3 and the normalized symbol error rates and the path metric amount average values of the 4 data rates is not true, or if the normalized symbol error rates and the path metric amount average values of the 4 data rates do not satisfy the conditions of the threshold value set 3 of 4800 bps which is the data rate having the correct CRC calculated result, then in the following steps S33, S35, S37 and S39, the threshold values of the threshold sets and the normalized symbol error rates and the path metric amount average values are compared with each other in the sequential order of the occurrence probabilities of the data rate of the traffic channel or in the sequential order of reliability when there are a plurality of reliabilities.

Accordingly, in decision step S33, normalized symbol error rates and path metric amount average values of 4 data rates are compared with threshold values of the threshold value set 5 of 1200 bps having the highest occurrence probability. If it is determined in decision step S33 that compared results of the normalized symbol error rates and the path metric amount average values of the 4 data rates with the threshold values of the threshold value set are all true, then the processing proceeds to step S34, wherein it is determined that the data rate is 1200 bps and that the reliability thereof is 1. Then, the processing is ended.

If it is determined in decision step S33 that any one of the compared results is not true, then the processing proceeds to decision step S35, wherein the normalized symbol error rates and the path metric amount average values of the 4 data rates are compared with threshold values of the threshold value set 1 of 9600 bps having the highest probability next to 1200 bps and which has the highest reliability. If it is determined in decision step S35 that compared results of the normalized symbol error rates and the path metric amount average values of the 4 data rates and the threshold values of the threshold set 1 are all true, then the processing proceeds to step S36, wherein it is determined that the data rate is 9600 and that the reliability thereof is 1. Then, the processing is ended.

If it is determined in decision step S35 that any one of the compared results of the normalized symbol error rates and the path metric amount average values of the 4 data rates and the threshold values of the threshold value set 1 is not true, then the processing proceeds to decision step S37, wherein the normalized symbol error rates and the path metric amount average values of the 4 data rates are compared with threshold values of the threshold value set 2 of 9600 bps and which has the second highest reliability. If it is determined in decision step S37 that compared results of the normalized symbol error rates and the path metric amount average values of the 4 data rates and the threshold values of the threshold value set 2 are all true, then the processing proceeds to step S38, wherein it is determined that the data rate is 9600 bps and that the reliability thereof is 2. Then, the processing is ended.

If it is determined in decision step S37 that any one of the compared results of the normalized symbol error rates and the path metric amount average values of the 4 data rates with the threshold values of the threshold value set 2 is not true, then the processing proceeds to decision step S39. It decision step S39, the normalized symbol error rates and the path metric amount average values of the 4 data rates are compared with threshold values of the threshold value set of 2400 bps having the high occurrence probability next to 9600 and which has the reliability 2. If it is determined in decision step S39 that compared results of the normalized symbol error rates and the path metric amount average values with the threshold values of the threshold value set 4 are all true, then the processing proceeds to step S40, wherein it is determined that the data rate is 2400 bps and that the reliability thereof is 1. Then, the processing is ended.

If it is determined in decision step S39 that any one of the compared results is not true, then the processing proceeds to step S41, wherein it is determined that the data cannot be decided. Then, the processing is ended.

Although the data rate of 4800 bps is the data rate having the highest occurrence probability next to 2400 bps as described above, in this case, the CRC calculated result of 4800 bps is correct and the normalized symbol error rates and the path metric amount average values of the 4 data rates and the threshold values of the threshold set 3 of 4800 bps are compared at the first decision step S31. Therefore, after the comparison processing using the threshold values of the threshold value set 4 of 2400 bps, the processing is ended.

Figure 15:
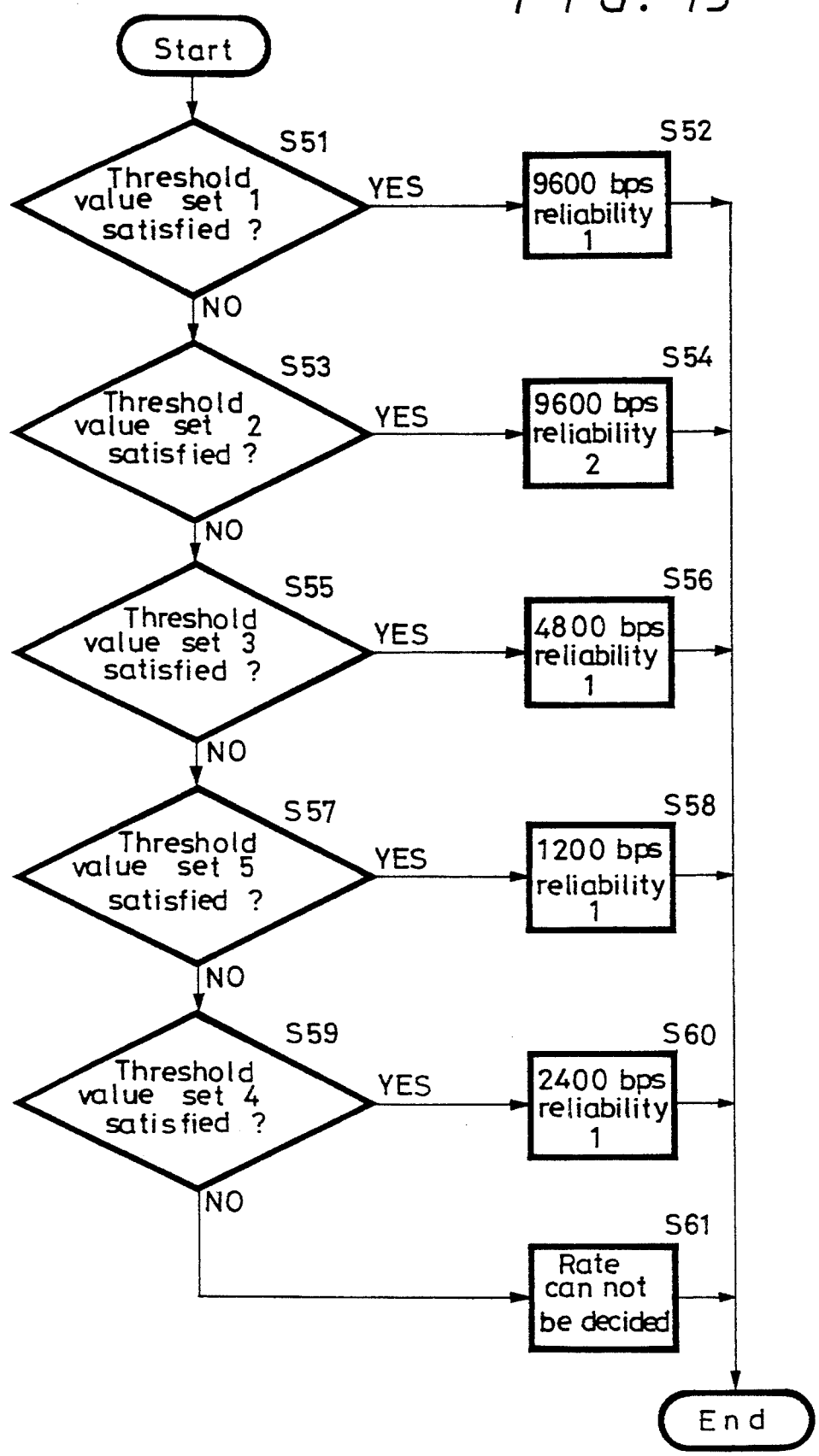
FIG. 15 is a flowchart to which reference will be made in explaining more in detail step S4 of the flowchart shown in FIG. 12.

The rate decision processing shown in step S4 (FIG. 12) will be described below. In decision step S51 shown in FIG. 15, threshold values of the threshold value set of 9600 bps having high occurrence probability in the threshold sets of 9600 bps and 4800 bps in which the CRC calculated result is correct, i.e., the threshold value set 1 of high reliability are compared with the normalized symbol error rates and the path metric amount average values of the 4 data rates are compared with each other.

If it is determined in decision step S51 that compared results are all true, then the processing proceeds to step S52, in which it is determined that the data rate is 9600 bps and that the reliability thereof 1. Then, the processing is ended.

If it is determined in decision step S51 that any one of the compared result is not true, then the processing proceeds to step S53. In step S53, of the threshold value sets of the threshold value table shown on the table 4 and of the threshold values of the threshold sets of 9600 bps and 4800 bps having the correct CRC calculated result, the threshold value set of 9600 bps having a high occurrence probability and which is the threshold value set 2 having a higher reliability are compared with the normalized symbol error rates and the path metric amount average values of 4 data rates.

If it is determined in decision step S53 that compared results are all true, then the processing proceeds to step S54, in which it is determined that the data rate is 9600 bps and that the reliability thereof is 2. Then, the processing is ended.

If it is determined in decision step S53 that any one of the compared results is not true, then the processing proceeds to decision step S55. In decision step S55, of the threshold value sets of the threshold value table shown on the table 4, the threshold value set 3 of 4800 bps having a high occurrence probability next to 9600 bps in threshold value sets of 9600 bps and 4800 bps in which the CRC calculated results are correct and normalized symbol error rates and path metric amount average values of the 4 data rates are compared with each other.

If it is determined in decision step S55 that compared results are all true, then the processing proceeds to step S56, wherein it is determined that the data rate is 4800 bps and that the reliability thereof is 1. Then, the processing is ended.

If it is determined in decision step S55 that any one of the compared results is not true, or if the normalized symbol error rates and the path metric amount average values of the 4 data rates cannot satisfy any of the conditions of the threshold value sets 1, 2 and 3 of 9600 bps or 4800 bps in which the CRC calculated result is correct, then in the following steps S57 and S59, similarly to FIG. 13 (or FIG. 14), the threshold values of the threshold set and the normalized symbol error rates and the path metric amount average values of the 4 data rates are compared each other in the sequential order based on the occurrence probability of the data rate of the traffic channel.

Then, on the basis of the compared results, it is determined in step S58 that the data rate is 1200 bps and that the reliability thereof is 1. Also, it is determined in step S60 that the data rate is 2400 bps and that the reliability thereof is 1 or it is determined in step S61 that data rate cannot be decided. Then, the processing is ended.

Figure 16:
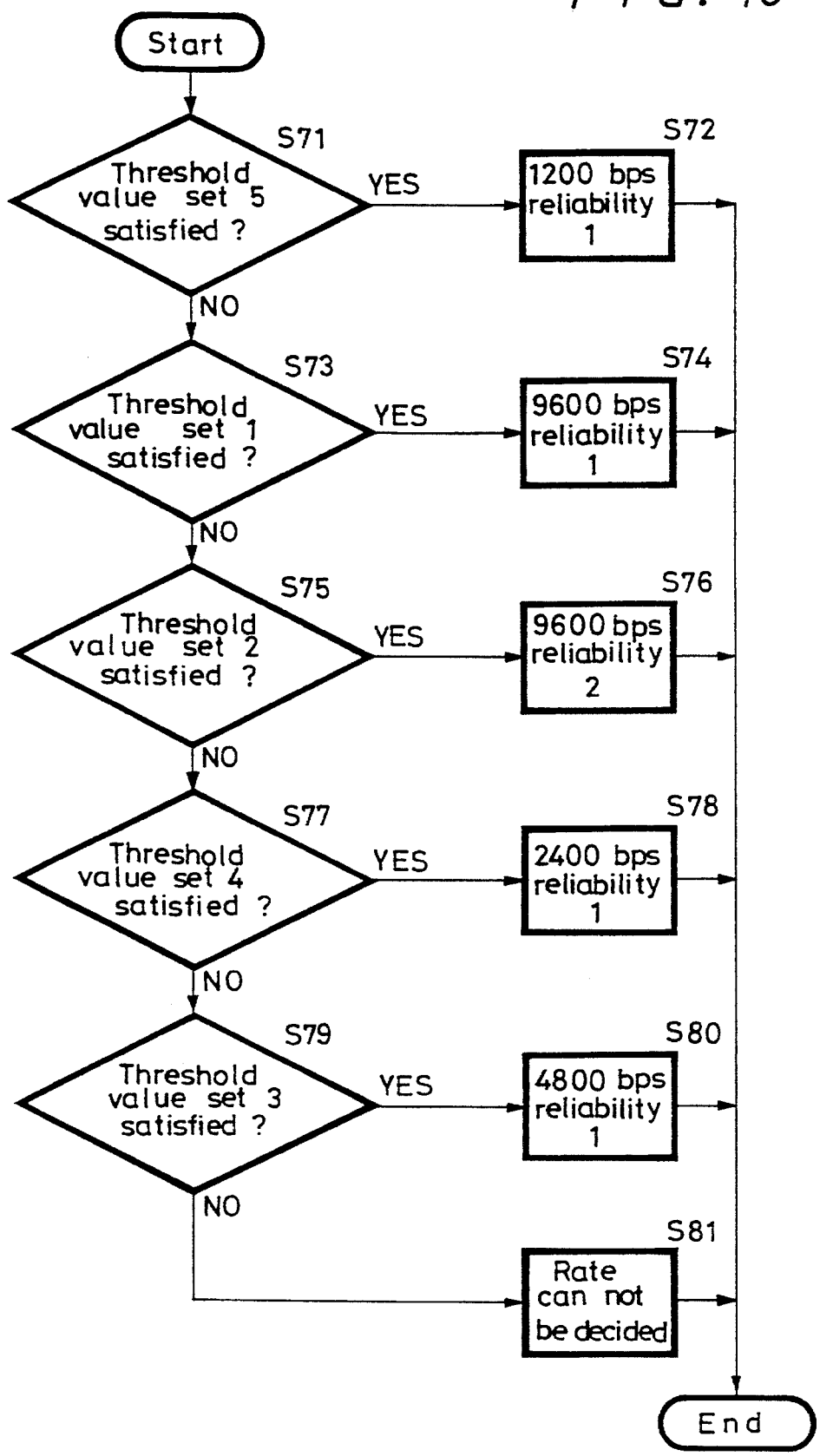
FIG. 16 is a flowchart to which reference will be made in explaining more in detail step S5 of the flowchart shown in FIG. 12.

Further, it is determined in the rate decision processing of step S5 (FIG. 12) that the CRC calculated results of 9600 bps an 4800 bps are neither correct. Therefore, in steps S71, S73, S75, S77 and S79 shown in FIG. 16, the threshold values of the threshold sets and the normalized symbol error rates and the path metric amount average values are compared with each other in the sequential order of the occurrence probability of data rate of traffic channel and reliability thereof.

On the basis of the compared results, it is determined in step S72 that the data rate is 1200 bps and that the reliability thereof is 1. It is determined in step S74 that the data rate is 9600 bps and that the reliability thereof is 1. It is determined in step S76 that the data rate is 9600 bps and that the reliability thereof is 2. It is determined in step S78 that the data rate is 2400 bps and that the reliability thereof is 1. It is determined in step S80 that the data rate is 4800 bps and that the reliability thereof is 1. Further, it is determined in step S81 that the data rate cannot be decided. Then, the processing is ended.

A decided result of the data rate output from the comparison and decision unit 41 (FIG. 11) is output to the decoded data memory unit 9 and then processed similarly to the first embodiment.

As described above, according to the second embodiment, the symbol error rate is calculated except the symbols corresponding to the punctured symbols. Also, when the normalized symbol error rate is calculated, the punctured symbol, the CRC code and the coefficient for compensating the influence of tail bit are multiplied with the normalized symbol error rate. Therefore, it is possible to obtain the normalized symbol error rate of high accuracy corresponding to substantial data. As a consequence, the decision of data rate can be carried out more accurately.

Since the sequential order of the threshold value sets that are compared with the normalized symbol error rates and the path metric amount average values of 4 data rates is changed in response to correct and incorrect CRC calculated results, if the CRC calculated result is correct in actual practice, then data rate can be decided rapidly with a few comparisons.

Since the comparisons using threshold value sets of 4 data rates are sequentially carried out even when the CRC calculated result is not correct, it is possible to prevent the data rate from being decided erroneously.

Since the comparisons are carried out by using threshold value sets in the sequential order of occurrence probabilities of data rates, it is possible to perform the decision of data rate rapidly.

While the present invention is applied to the mobile radio communication system as described above, the present invention is not limited thereto and can be applied to a decoding apparatus which decodes a signal whose data rate can be varied.

While the threshold value set of 9600 bps which has a plurality of reliabilities (1 and 2) is illustrated in the threshold value table on the table 4 according to the second embodiment, the present invention is not limited thereto and threshold value sets corresponding to a plurality of reliabilities may be used for other data rates.

While the threshold value table memorized in the threshold value memory unit 27 is determined when the sync channel is received according to the first and second embodiments, the present invention is not limited thereto and the threshold value table memorized in the threshold value memory unit 27 may be determined when the traffic channel is received.

Figure 17:
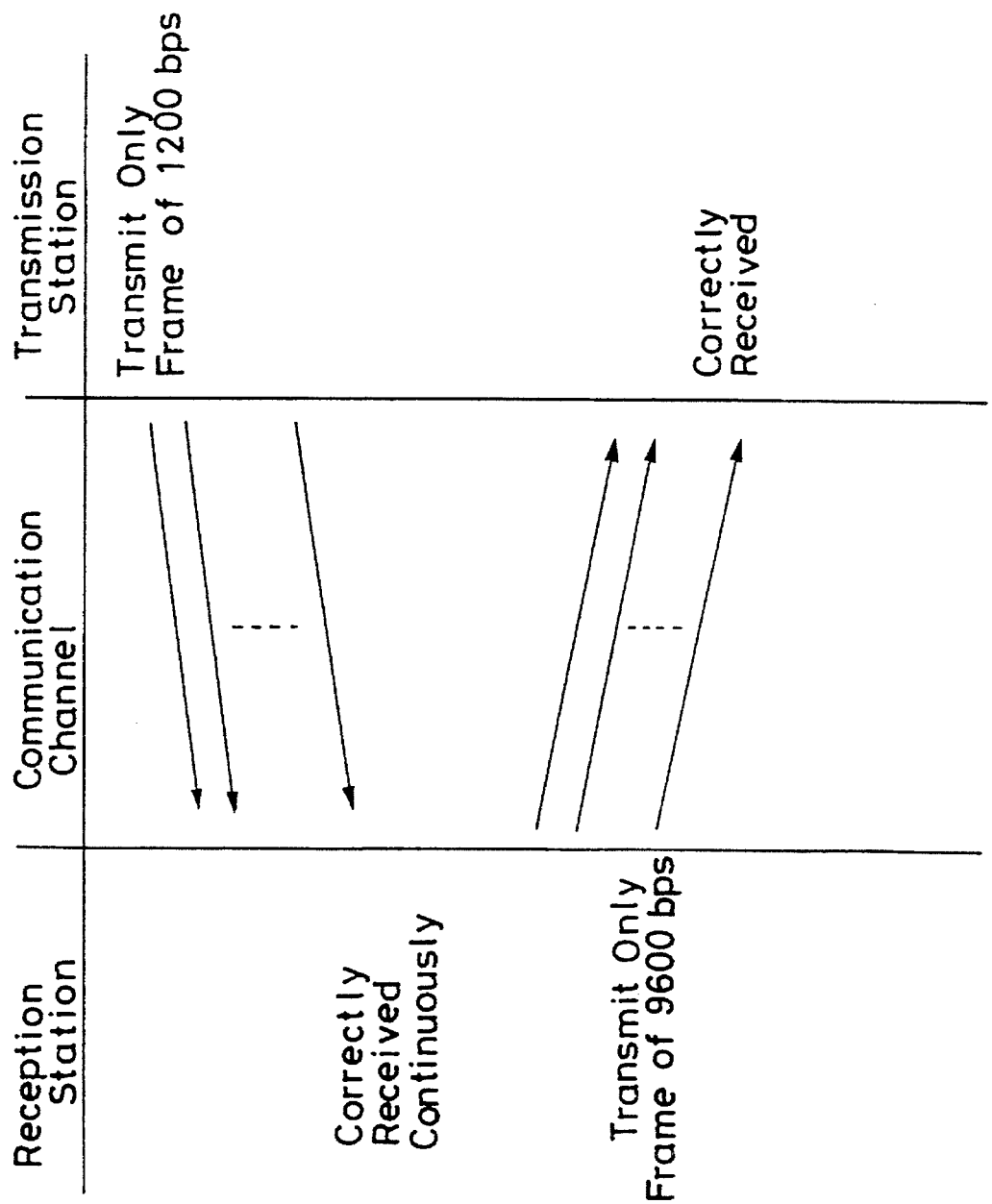
FIG. 17 is a diagram used to explain a communication procedure in the traffic channel.

Specifically, immediately after the sync channel is switched to the traffic channel, as shown in FIG. 17, a plurality of frames at the fixed data rate (e.g., 1200 bps, etc.) are transmitted from a transmission side (transmission station side). If the mobile radio set (reception station) receives them correctly, then a plurality of frames at the fixed data rate (e.g., 9600 bps, etc.) are transmitted to the transmission side and correctly received by the transmission side, thereby a communication channel being established.

Accordingly, while a plurality of frames at the fixed data rate, such as 1200 bps or the like are transmitted from the transmission side, the threshold value table memorized in the threshold value memory unit 27 may be determined similarly when the sync channel is received.

In this case, since the threshold value table used in the comparison is determined when the traffic channel used in actual communication is received, the data rate can be decided more accurately.

While the comparison is carried out by using the threshold value table after the threshold value table memorized in the threshold value memory unit 27 is determined when the sync channel is received according to the first and second embodiments, the present invention is not limited thereto and the threshold value table used in the comparison may be varied by supplying the Eb/NO value to the threshold value setting unit 23 or 42 at regular intervals, for example, when the traffic channel is received.

While the symbol error rates are calculated except the symbol corresponding to the punctured symbol according to the second embodiment, if an error of normalized symbol error rates calculated from the symbol error rates including the symbols corresponding to the punctured symbols falls within a tolerance range, then it is possible to calculate the symbol error rates under the condition that the symbols corresponding to the punctured symbols are not excluded. In this case, the punctured symbol detection unit 31 (FIG. 10) may be omitted and the decoding apparatus may therefore be miniaturized.

According to the decoding apparatus of the present invention, the most likelihood decoding means decodes received data in a most likelihood decoding fashion on the basis of the Viterbi algorithm. Then, a variable data rate of a second channel is decided on the basis of an output from the most likelihood decoding means. Therefore, the data rate can be decided with ease.

According to the decoding apparatus of the present invention, the symbol error rate is calculated on the basis of the output from the most likelihood decoding means, and the data rate of the second channel is decided on the basis of the calculated symbol error rate and a path metric amount which is one of the outputs from the most likelihood decoding means. Therefore, the data rate can be decided with high accuracy.

According to the decoding apparatus of the present invention, the second channel includes an error detection code and an error detection is carried out on the basis of the error detection code output from the most likelihood decoding means. Then, the data rate of the second channel is decided on the basis of the error detected result, the symbol error rate and the path metric amount. Therefore, the date rate can be decided with higher accuracy.

According to the decoding apparatus of the present invention, a threshold value of symbol error rate or path metric amount is set at every data rate of the second channel on the basis of the output from the most likelihood decoding means, and the threshold value and the symbol error rate and the path metric amount are compared with each other. Then, the data rate of the second channel is decided on the basis of the compared result. Therefore, the data rate can be decided with ease.

According to the decoding apparatus of the present invention, the threshold value setting means sets a threshold value on the basis of the output of the most likelihood decoding means corresponding to the first channel. Therefore, there is plenty of time to decide the data rate after the threshold value was set. Thus, it is possible to prevent too much load from being put on the apparatus.

According to the decoding apparatus of the present invention, the threshold value setting means set a threshold value on the basis of the output from the most likelihood decoding means corresponding to the second channel. Therefore, the threshold value is set immediately before the data rate is decided so that the data rate can be decided with high accuracy.

According to the decoding apparatus of the present invention, the threshold value is set at every reliability. Then, the symbol error rate and the path metric amount are sequentially compared with threshold values of high reliability at high to low data rates and also compared with threshold value of reliability next to the former one at high to low data rates. Therefore, when the symbol error rate and the path metric amount correspond to the threshold values of high reliability and high data rate, the decided result of data rate can be obtained immediately.

Further, according to the decoding apparatus of the present invention, the threshold value setting means sets the threshold value at every reliability. If a line short standard estimated when the data rate of the second channel is decided is worse than that estimated when the threshold value setting means sets the threshold value, then the reliability of the threshold value applied in order to decide the data rate of the second channel is lowered and output. Accordingly, the reliability of the decided result of the data rate is varied. When the reliability is low, the decided result is not used. Therefore, it is possible to prevent the apparatus from malfunctioning. Further, according to the decoding apparatus of the present invention, the sequential order of the threshold values set at every data rate of the second channel and which are to be compared with the symbol error rate and the path metric amount is determined on the basis of the error detected result of the error detection means. Therefore, the data rate can be decided rapidly with higher accuracy.

Furthermore, according to the decoding apparatus of the present invention, the threshold values are compared with the symbol error rate and the path metric amount in the sequential order of threshold values corresponding to data rates that the second channel can take with large possibility. Therefore, the date rate can be decided more rapidly.

Having described preferred embodiments of the invention with reference to the accompanying drawings, it is to be understood that the invention is not limited to those precise embodiments and that various changes and modifications could be effected therein by one skilled in the art without departing from the spirit or scope of the invention as defined in the appended claims.

What is claimed is:

1. A received data decoding apparatus for receiving and decoding transmitted convolutional code data, said received data being formed of a first channel whose data rate is fixed and a second channel whose data rate is variable, comprising:

most likelihood decoding means for decoding said received data on the basis of a Viterbi algorithm; and data rate deciding means for obtaining a predetermined data rate of said second channel determined according to a path metric amount which is a decoded output from said most likelihood decoding means.

2. A received data decoding apparatus according to claim 1, further comprising:

symbol error rate calculating means for calculating a symbol error rate of said received data by using an output from said most likelihood decoding means, wherein said data rate deciding means obtains a predetermined data rate of said second channel determined according to said path metric amount and said symbol error rate.

3. A received data decoding apparatus according to claim 2, wherein said second channel includes an error detection code for detecting an error of said received data, error detecting means is provided in order to perform an error detection calculation on the basis of said error detection code included in a decoded output from said most likelihood decoding means, and said data rate deciding means obtains a predetermined data rate of said second channel determined according to said path metric amount, said symbol error rate and a result of said error detection calculation.

4. A received data decoding apparatus according to claim 3, wherein said data rate deciding means comprises:

Eb/No value estimating means for estimating an Eb/No value representing a ratio of transmission energy relative to a noise obtained from said path metric amount and said symbol error rate;

threshold value setting means for setting a threshold value table representing any of said data rates classified in response to said Eb/No value when said path metric amount and said symbol error rate fall within any range; and comparing means for obtaining an optimum data rate of said received data by comparing said path metric amount and said symbol error rate with threshold values of said threshold value table.

5. A received data decoding apparatus according to claim 4, wherein said Eb/No value estimating means estimates an Eb/No value on the basis of said path metric amount and said symbol error rate obtained when said second channel is decoded in a most likelihood decoding fashion.

6. A received data decoding apparatus according to claim 4, wherein said Eb/No value estimating means estimates an Eb/No value on the basis of said path metric amount and said symbol error rate obtained when said first channel is decoded in a most likelihood decoding fashion.

7. A received data decoding apparatus according to claim 6, wherein at least one threshold value of said threshold values in said threshold value setting means is set at a value representative of a reliability of said data rate decision, and said comparing means compares said path metric amount and said symbol error rate with threshold values of high reliability in the sequential order of high to low data rates and also compares said path metric amount and said symbol error rate with threshold values of lower reliability in the sequential order of high to low data rates.

8. A received data decoding apparatus according to claim 7, wherein said comparing means decides said data rate by comparing said threshold value corresponding to said error detected result in said threshold value table with said symbol error rate and said path metric amount.

9. A received data decoding apparatus according to claim 8, wherein said comparing means compares said symbol error rate and said path metric amount with said threshold value in the sequential order of said threshold value of a data rate that said second channel can take with a large possibility.

10. A received data decoding apparatus according to claim 6, wherein at least one threshold value of said threshold values in said threshold value setting means is set at a value representative of a reliability of said data rate decision, and said comparing means lowers and outputs said reliability if said Eb/No value estimated when a data rate of said second channel is decided is worse than said Eb/No value estimated when said threshold value is set by said threshold value setting means.

11. A received data decoding apparatus for receiving and decoding transmitted convolutional code data, said received data being formed of a first channel whose data rate is fixed and a second channel whose data rate is variable, comprising:

most likelihood decoding means for decoding said received data on the basis of a Viterbi algorithm;

symbol error rate calculating means for calculating a symbol error rate of said received data by using an output from said most likelihood decoding means; and data rate deciding means for obtaining a predetermined data rate of said second channel determined according to a path metric amount which is a decoded output from said most likelihood decoding means.

12. A received data decoding apparatus according to claim 11, further comprising:

punctured symbol detecting means for detecting a punctured symbol from said received data, wherein said symbol error rate calculating means excludes said detected punctured symbol from calculation of said symbol error rate.

13. A method for receiving and decoding transmitted convolutional code data, said received data being formed of a first channel whose data rate is fixed and a second channel whose data rate is variable, comprising the steps of:

decoding said received data on the basis of a Viterbi algorithm; and obtaining a predetermined data rate of said second channel determined according to a path metric amount generated by the Viterbi algorithm.

14. The method of claim 13, further comprising the steps of:

calculating a symbol error rate of said received data by using an output generated by the Viterbi algorithm; and obtaining a predetermined data rate of said second channel determined according to said path metric amount and said symbol error rate.

15. The method of claim 14, further comprising the steps of:

detecting an error of said received data; performing an error detection calculation on the basis of an error detection code included in a decoded output generated by the Viterbi algorithm; and obtaining a predetermined data rate of said second channel according to said path metric amount, said symbol error rate and a result of said error detection calculation.

16. The method of claim 15, further comprising the steps of:

estimating an Eb/No value representing a ratio of transmission energy relative to a noise obtained from said path metric amount and said symbol error rate;

setting a threshold value table representing any of said data rates classified in response to said Eb/No value when said path metric amount and said symbol error rate fall within any range; and obtaining an optimum data rate of said received data by comparing said path metric amount and said symbol error rate with threshold values of said threshold value table.

17. The method of claim 16, further comprising the step of:

estimating an Eb/No value on the basis of said path metric amount and said symbol error rate obtained when said second channel is decoded in a most likelihood decoding fashion.

18. The method of claim 16, further comprising the step of:

estimating an Eb/No value on the basis of said path metric amount and said symbol error rate obtained when said first channel is decoded in a most likelihood decoding fashion.

19. The method of claim 18, further comprising the steps of:

setting at least one threshold value of said threshold values at a value representative of a reliability of said predetermined data rate of said second channel; and lowering and outputting said reliability if said Eb/No value estimated when a data rate of said second channel is decided is worse than said Eb/No value estimated when said threshold value is set in response to said Eb/No value when said path metric amount and said symbol error rate fall within any range.

20. The method of claim 18, further comprising the steps of:

setting at least one threshold value of said threshold values at a value representative of a reliability of said predetermined data rate of said second channel;

comparing said path metric amount and said symbol error rate with threshold values of high reliability in the sequential order of high to low data rates; and comparing said path metric amount and said symbol error rate with threshold values of lower reliability in the sequential order of high to low data rates.

21. The method of claim 20, further comprising the steps of:

deciding said data rate by comparing said threshold value corresponding to said a result of said error detection calculation in said threshold value table with said symbol error rate and said path metric amount.

22. The method of claim 21, further comprising the step of:

comparing said symbol error rate and said path metric amount with said threshold value in the sequential order of said threshold value of a data rate that said second channel can take with a large possibility.

23. A method for receiving and decoding transmitted convolutional code data, said received data being formed of a first channel whose data rate is fixed and a second channel whose data rate is variable, comprising the steps of:

decoding said received data on the basis of a Viterbi algorithm;

calculating a symbol error rate of said received data by using an output generated by the Viterbi algorithm; and obtaining a predetermined data rate of said second channel determined according to a path metric amount generated by the Viterbi algorithm.

24. The method of claim 23, further comprising the step of:

detecting a punctured symbol from said received data, wherein when calculating said symbol error rate said detected punctured symbol is excluded from said calculation.

* * * * *